(12) United States Patent
Parkes, Jr. et al.

(10) Patent No.: US 11,329,650 B2
(45) Date of Patent: May 10, 2022

(54) PROCESS AND TEMPERATURE IMMUNITY IN CIRCUIT DESIGN

(71) Applicant: Intel Corporation, Santa Clara, CA (US)

(72) Inventors: John J. Parkes, Jr., Chandler, AZ (US); Anamul Hoque, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/957,615

(22) PCT Filed: Mar. 29, 2018

(86) PCT No.: PCT/US2018/025131
§ 371 (c)(1),
(2) Date: Jun. 24, 2020

(87) PCT Pub. No.: WO2019/190526
PCT Pub. Date: Oct. 3, 2019

(65) Prior Publication Data
US 2020/0336144 A1 Oct. 22, 2020

(51) Int. Cl.
*H03F 1/30* (2006.01)
*H03K 19/0185* (2006.01)
(Continued)

(52) U.S. Cl.
CPC ..... *H03K 19/018571* (2013.01); *G05F 3/242* (2013.01); *H03F 1/02* (2013.01);
(Continued)

(58) Field of Classification Search
CPC .......................................................... H03F 1/30
(Continued)

(56) References Cited

U.S. PATENT DOCUMENTS 4,348,596 A * 9/1982 Atherton .............. H03K 5/2472
326/107
4,477,737 A 10/1984 Ulmer et al.
(Continued)

FOREIGN PATENT DOCUMENTS

KR     20100136991 A    12/2010

OTHER PUBLICATIONS

"International Application Serial No. PCT US2018 025131, International Preliminary Report on Patentability dated Oct. 8, 2020", 16 pgs.

(Continued)

*Primary Examiner* — Henry Choe
(74) *Attorney, Agent, or Firm* — Schwegman Lundberg & Woessner, P.A.

(57) ABSTRACT

An apparatus can include tracking circuitry coupled to a current source and configured to generate a reference voltage signal based on a reference current signal from the current source. The apparatus can include voltage regulator circuitry coupled to the tracking circuitry and configured to generate a voltage supply signal based on the reference voltage signal. The apparatus can further include amplifier circuitry configured to amplify an input signal based on the voltage supply signal. The reference voltage signal can track process and temperature variations associated with at least one field effect transistor within the tracking circuitry. The voltage regulator circuitry can be configured to operate with a closed loop gain higher than 1. The tracking circuitry includes a first transistor connected in parallel with a second transistor, the first and second transistors having a complimentary type with each other (e.g., NMOS and PMOS transistors).

24 Claims, 22 Drawing Sheets

(51) Int. Cl.
  *G05F 3/24*       (2006.01)
  *H03F 1/02*       (2006.01)
  *H03F 3/195*      (2006.01)
  *H03F 3/24*       (2006.01)
  *H03F 3/30*       (2006.01)

(52) U.S. Cl.
  CPC ............ *H03F 1/301* (2013.01); *H03F 3/195* (2013.01); *H03F 3/245* (2013.01); *H03F 3/301* (2013.01)

(58) Field of Classification Search
  USPC ........................................ 330/289, 296, 285
  See application file for complete search history.

(56) References Cited

U.S. PATENT DOCUMENTS

| | | | |
|---|---|---|---|
| 6,781,417 B1 | 8/2004 | Le et al. | |
| 8,680,925 B2 * | 3/2014 | Christen | ................ H03F 3/005 330/297 |
| 2012/0206209 A1 * | 8/2012 | Kaufman | ................ H03L 1/026 331/107 A |
| 2012/0268212 A1 | 10/2012 | Christen | |
| 2013/0201578 A1 | 8/2013 | Hoque et al. | |

OTHER PUBLICATIONS

"International Application Serial No. PCT/US2018/025131, International Search Report dated Dec. 24, 2018", 3 pgs.
"International Application Serial No. PCT/US2018/025131, Written Opinion dated Dec. 24, 2018", 14 pgs.

* cited by examiner

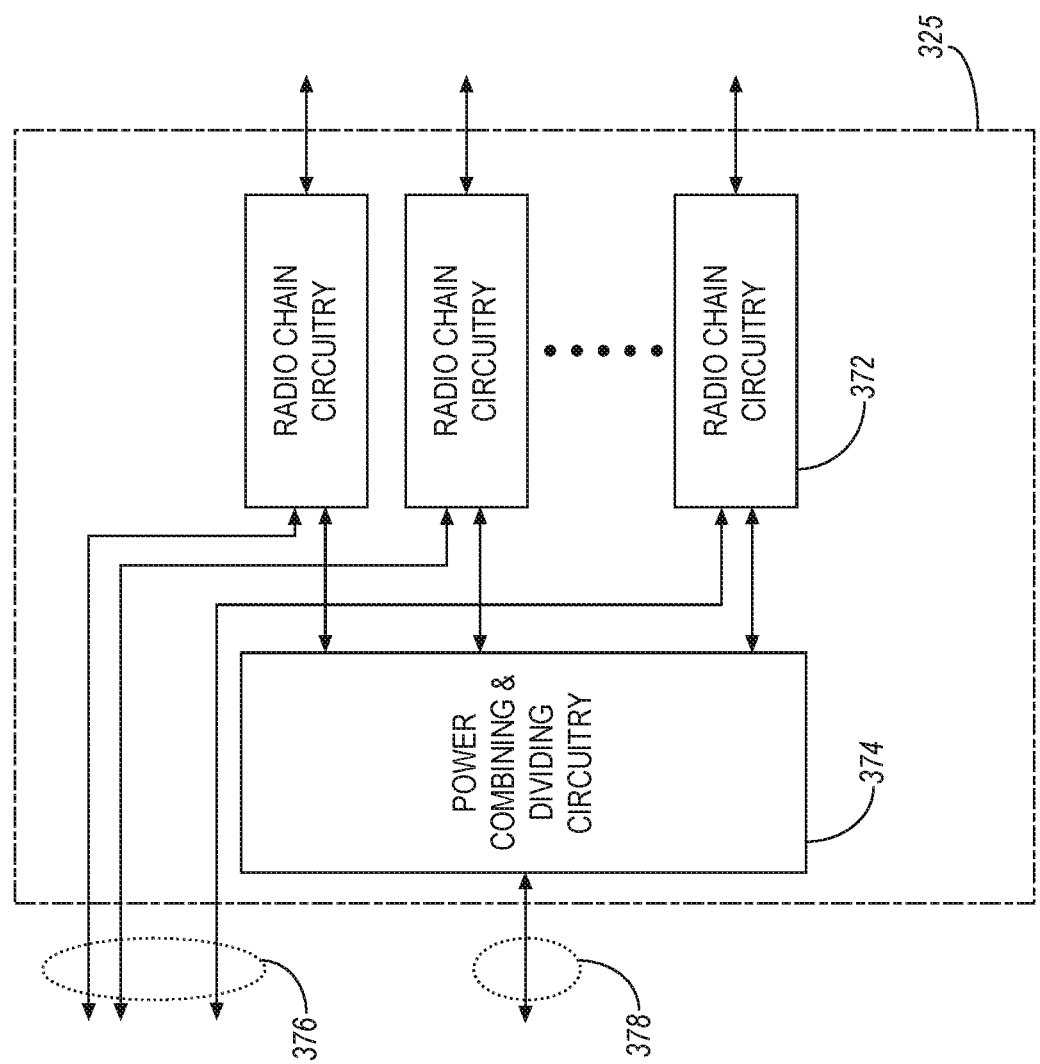

US 11,329,650 B2

PROCESS AND TEMPERATURE IMMUNITY IN CIRCUIT DESIGN

This patent application is a U.S. National Stage Filing under 35 U.S.C. 371 from International Application No. PCT/US2018/025131, filed Mar. 29, 2018 and published in English as WO 2019/190526 on Oct. 3, 2019, which is hereby incorporated by reference herein in its entirety.

TECHNICAL FIELD

Aspects pertain to wireless signal processing techniques. Some aspects relate to a wireless transceiver architecture. Some aspects relate to process and temperature immunity in amplifier design or design of other circuits, such as other digital or analog circuits. Some aspects relate to techniques for reducing variation of frequency dependent current consumption over temperature and CMOS process.

BACKGROUND

The ubiquity of wireless communication has continued to raise a host of challenging issues. In particular, challenges have evolved with the advent of mobile communication systems, such as 5G communications systems due to both the wide variety of devices with different needs and the spectrum to be used. In particular, the ranges of frequency bands used in communications has increased, most recently due to the incorporation of carrier aggregation of licensed and unlicensed bands and the upcoming use of the mmWave bands.

MIMO communication devices are beginning to become practical consumer products. However, challenges remain with how to efficiently configure the devices while at the same time minimize cross-talk interference, reduce current drain, reduce mixer supply/ground noise, and further increase device performance. Current consumption can be a key performance index in mobile communications, especially when the transmission path is digital. However, digital switching current can vary over process and temperature significantly when supplied by a fixed regulated voltage. Furthermore, using the fixed regulated voltage as a voltage supply to an amplifier can result in deteriorating amplifier linearity.

BRIEF DESCRIPTION OF THE DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which:

FIG. 3D illustrates aspects of exemplary radio frequency circuitry illustrated in FIG. 3A according to some aspects.

DETAILED DESCRIPTION

Figure 1:
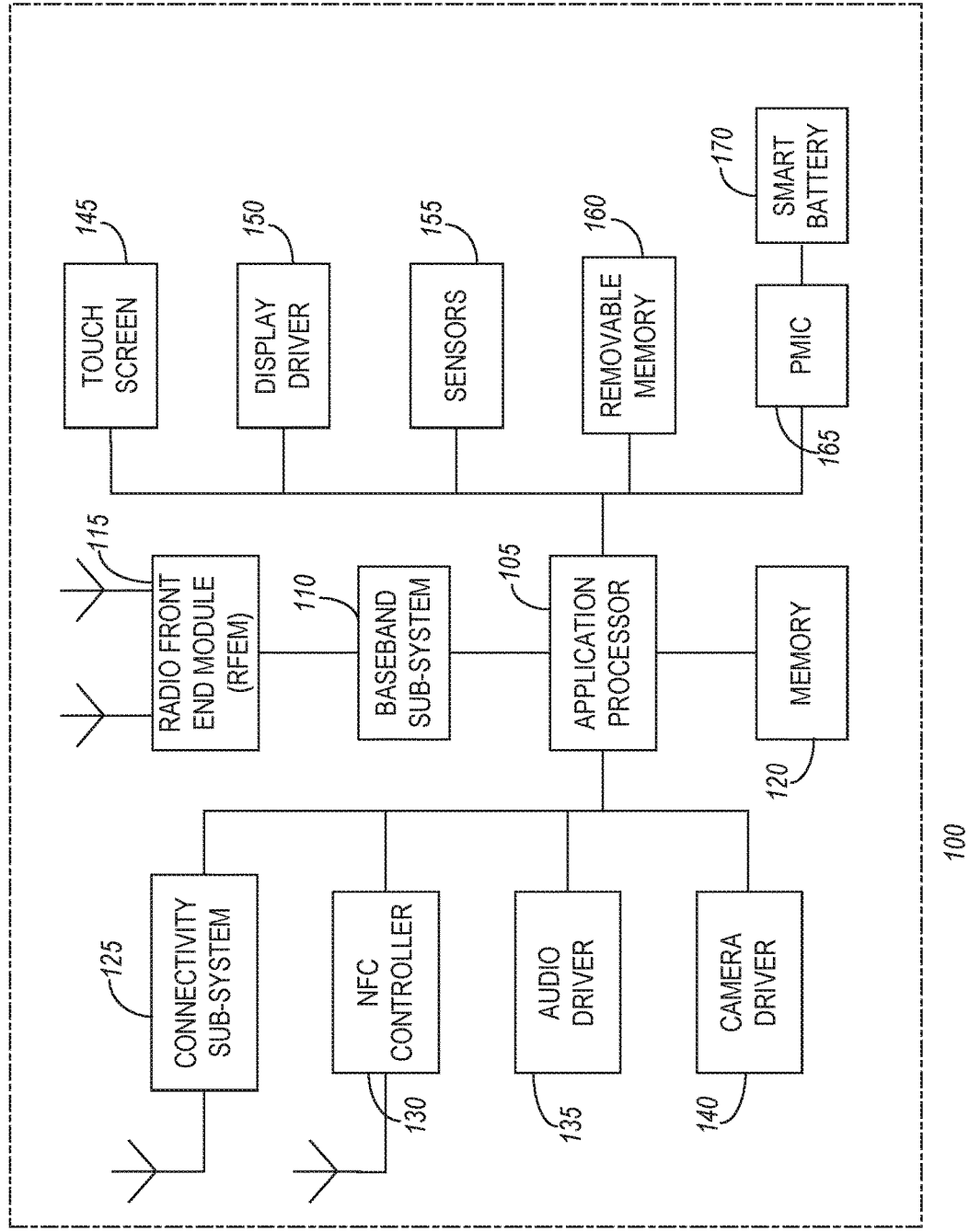
FIG. 1 illustrates an exemplary user device according to some aspects.

The following description and the drawings sufficiently illustrate specific aspects to enable those skilled in the art to practice them. Other aspects may incorporate structural, logical, electrical, process, and other changes.

Portions and features of some aspects may be included in, or substituted for, those of other aspects. Aspects set forth in the claims encompass all available equivalents of those claims.

With the advancement of wireless communications, such as 3G, 4G and 5G communications, several challenges have evolved in the wireless transceiver design, such as maintaining amplifier linearity and digital circuit current consumption constant in the presence of process and temperature variation. In some aspects, process and temperature (PT) tracking circuitry can be used (e.g., as part of power supply circuitry or other type of reference signal generation circuitry) for generating one or more voltage reference signals, which track the PT variations. The voltage reference signals can be used (e.g., by a voltage regulator) to generate one or more voltage supply signals, which can be modulated on the voltage reference signals and, therefore, can be adjusted based on the PT variations.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one aspect", "an aspect", "an example aspect", "some aspects", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some aspects may be used in conjunction with various devices and systems, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may, for example, be used in conjunction with devices and/or networks operating in accordance with existing IEEE 802.11 standards (including IEEE 802.11-2016 (IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PITY) Specifications, Dec. 7, 2016); IEEE802.11ay (P802.11ay Standard for Information Technology—Telecommunications and Information Exchange Between Systems Local and Metropolitan Area Networks—Specific Requirements Part 11: Wireless LAN Medium Access Control (MAC) and Physical Layer (PHY) Specifications—Amendment: Enhanced Throughput for Operation in License-Exempt Bands Above 45 GHz)) and/or future versions and/or derivatives thereof, devices and/or networks operating in accordance with existing WiFi Alliance (WFA) Peer-to-Peer (P2P) specifications (including WiFi P2P technical specification, version 1.5, Aug. 4, 2015) and/or future versions and/or derivatives thereof, devices and/or networks operating in accordance with existing Wireless-Gigabit-Alliance (WGA) specifications (including Wireless Gigabit Alliance, Inc WiGig MAC and PHY Specification Version 1.1, April 2011, Final specification) and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that is integrated with a computer, or a peripheral that is attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting and/or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative aspects may be used in conjunction with a wireless communication network communicating over a frequency band above 45 Gigahertz (GHz), e.g., 60 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a frequency band above 45 GHz, a frequency band below 20 GHz, e.g., a Sub 1 GHz (S1G) band, a 2.4 GHz hand, a 5 GHz band, a WLAN frequency band, a WPAN frequency band, a frequency band according to the WGA specification, and the like.

As used herein, the term "circuitry" may, for example, refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some aspects, circuitry may include logic, at least partially operable in hardware. In some aspects, the circuitry may be implemented as part of and/or in the form of a radio virtual machine (RVM), for example, as part of a Radio processor (RP) configured to execute code to configured one or more operations and/or functionalities of one or more radio components.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna" or "antenna array", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

FIG. 1 illustrates an exemplary user device according to some aspects. The user device 100 may be a mobile device in some aspects and includes an application processor 105, baseband processor 110 (also referred to as a baseband sub-system), radio front end module (RFEM) 115, memory 120, connectivity sub-system 125, near field communication (NFC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose IO, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband sub-system 110 and RFEM 115 in a mmWave system is shown in FIG. 1A.

Figure 1A:
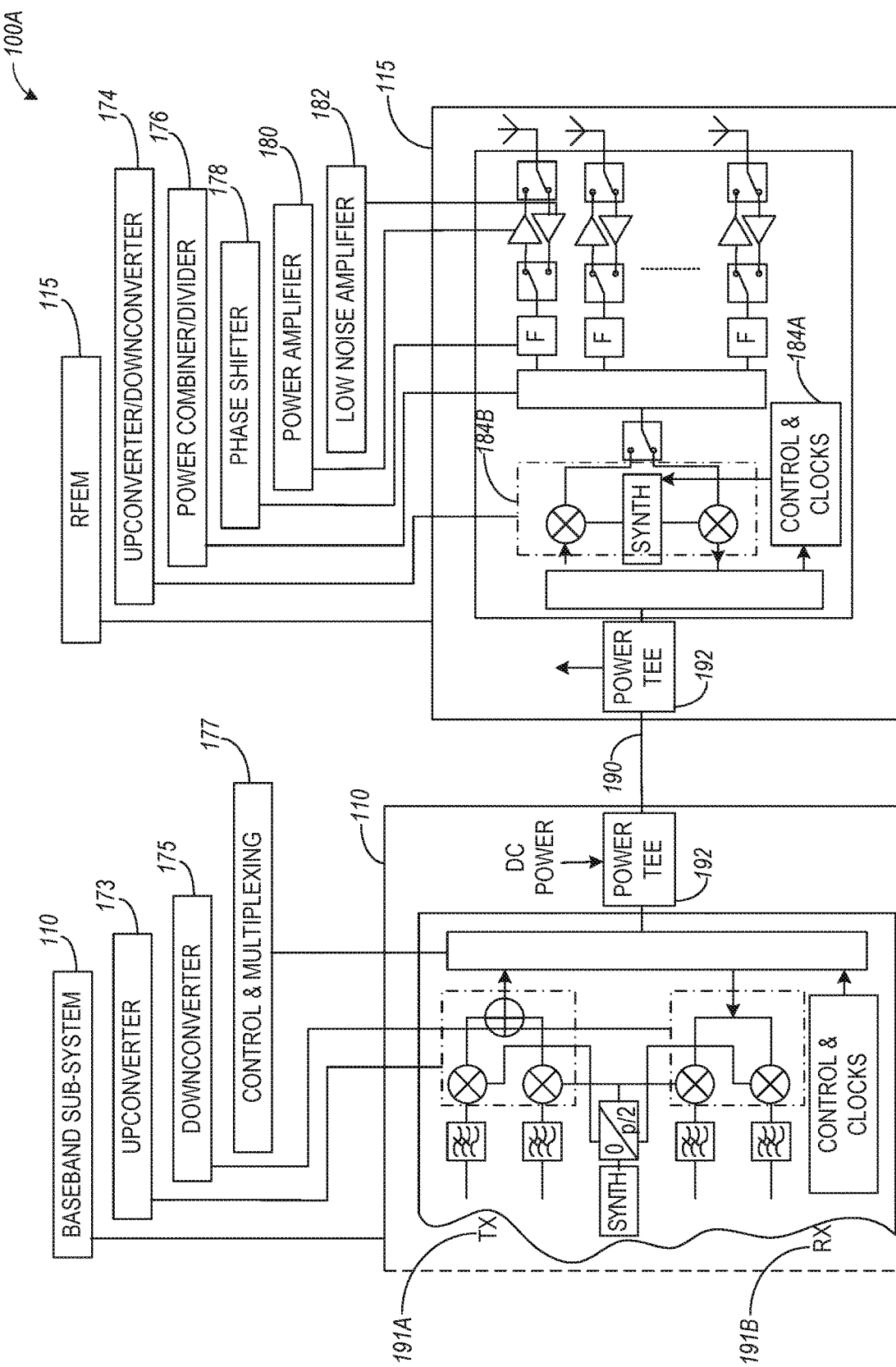
FIG. 1A illustrates a mmWave system, which can be used in connection with the device of FIG. 1 according to some aspects.

FIG. 1A illustrates a mmWave system 100A, which can be used in connection with the user device 100 of FIG. 1 according to some aspects of the present disclosure. The mmWave system 100A includes two components: a baseband sub-system 110 and one or more radio front end modules (RFEMs) 115. The RFEM 115 can be connected to the baseband processor 110 by a single cable 190, such as a coaxial cable, which supplies a modulated intermediate frequency (IF) signal, DC power, clocking signals and control signals.

The baseband sub-system 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion downconversion 174 so that the IF signals over the coaxial cable 190 can be at a lower frequency. Additional system context for mmWave 5G apparatuses, techniques and features is discussed herein below.

Figure 2:
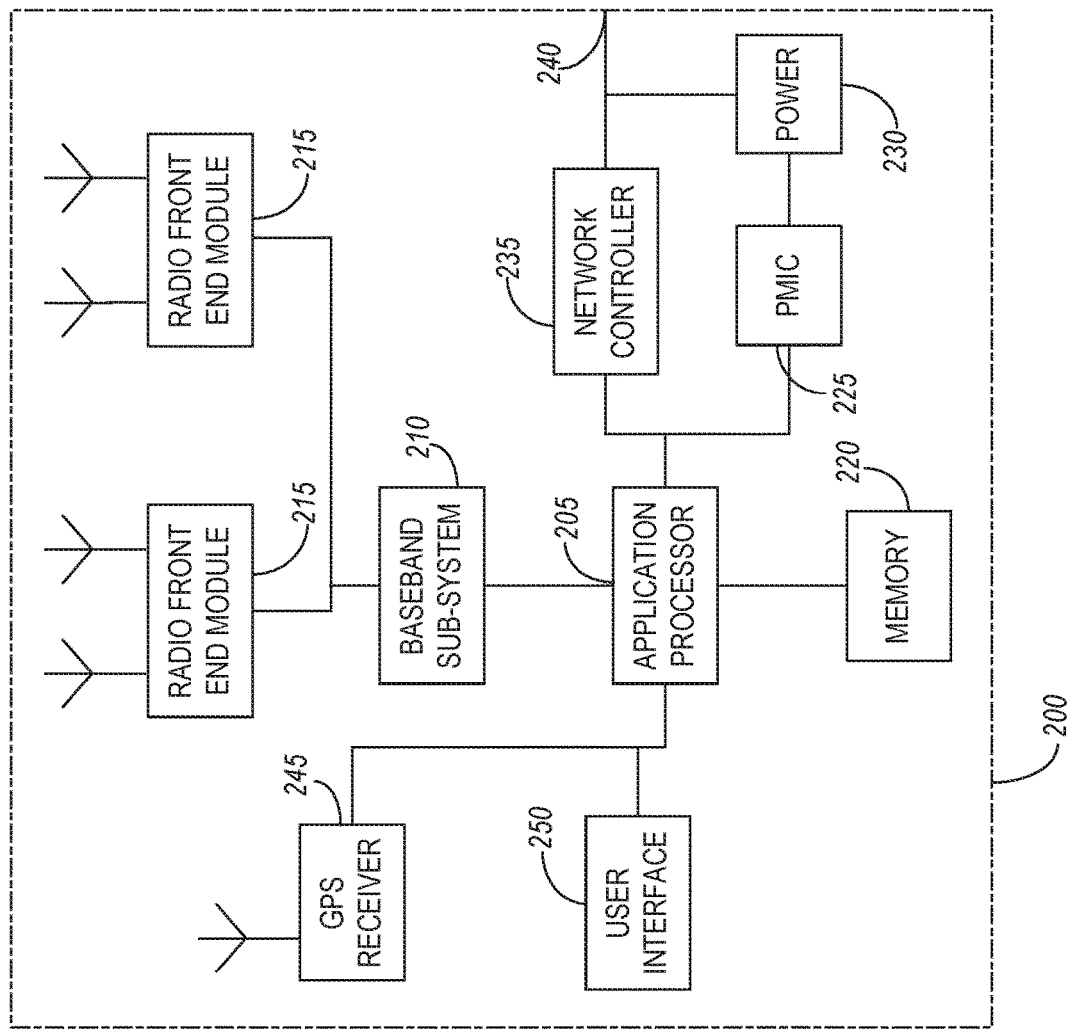
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I2C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The satellite navigation receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
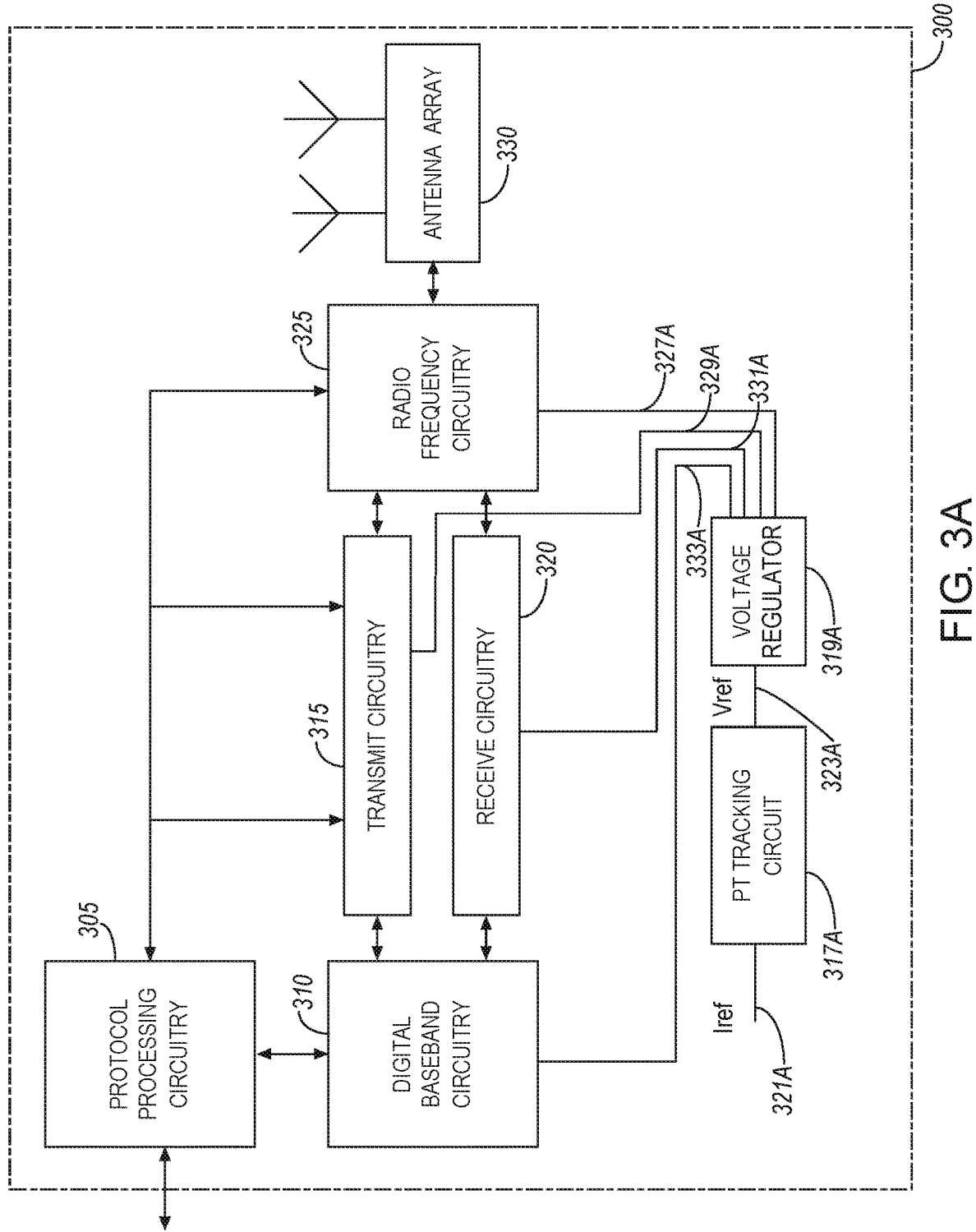
FIG. 3A illustrates exemplary wireless communication circuitry with a process and temperature (PT) tracking circuit, according to some aspects.
Figure 3B:
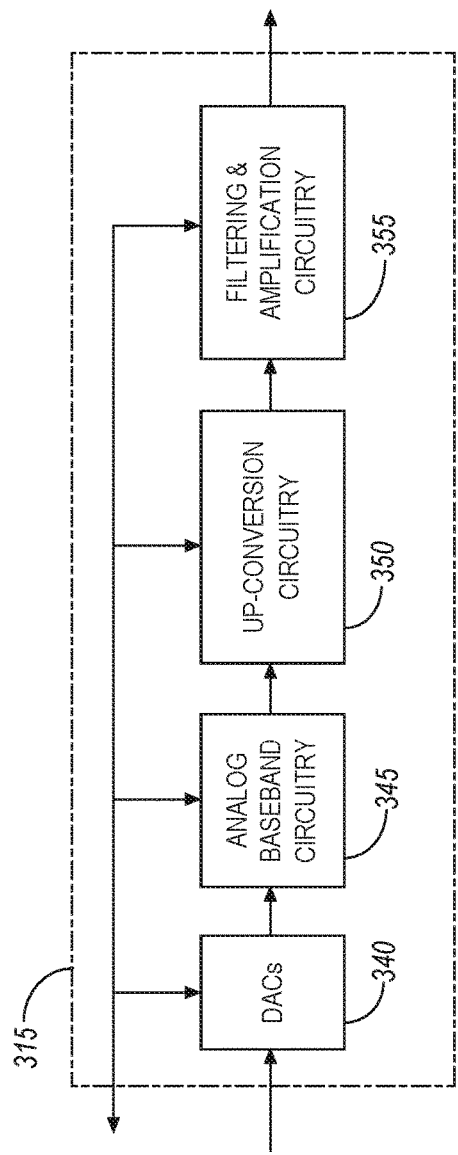
FIG. 3B illustrates aspects of exemplary transmit circuitry illustrated in FIG. 3A according to some aspects.
Figure 3C:
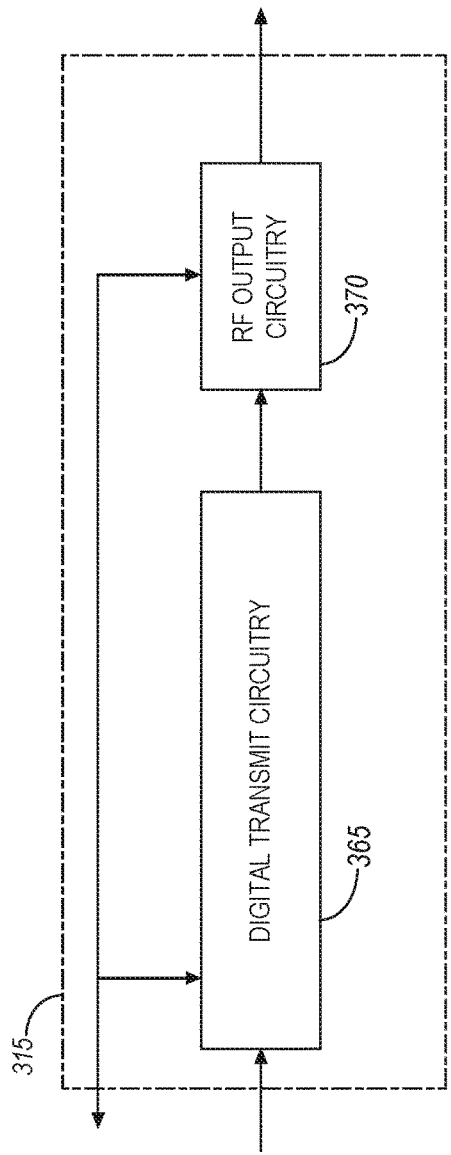
FIG. 3C illustrates aspects of exemplary transmit circuitry illustrated in FIG. 3A according to some aspects.
Figure 3E:
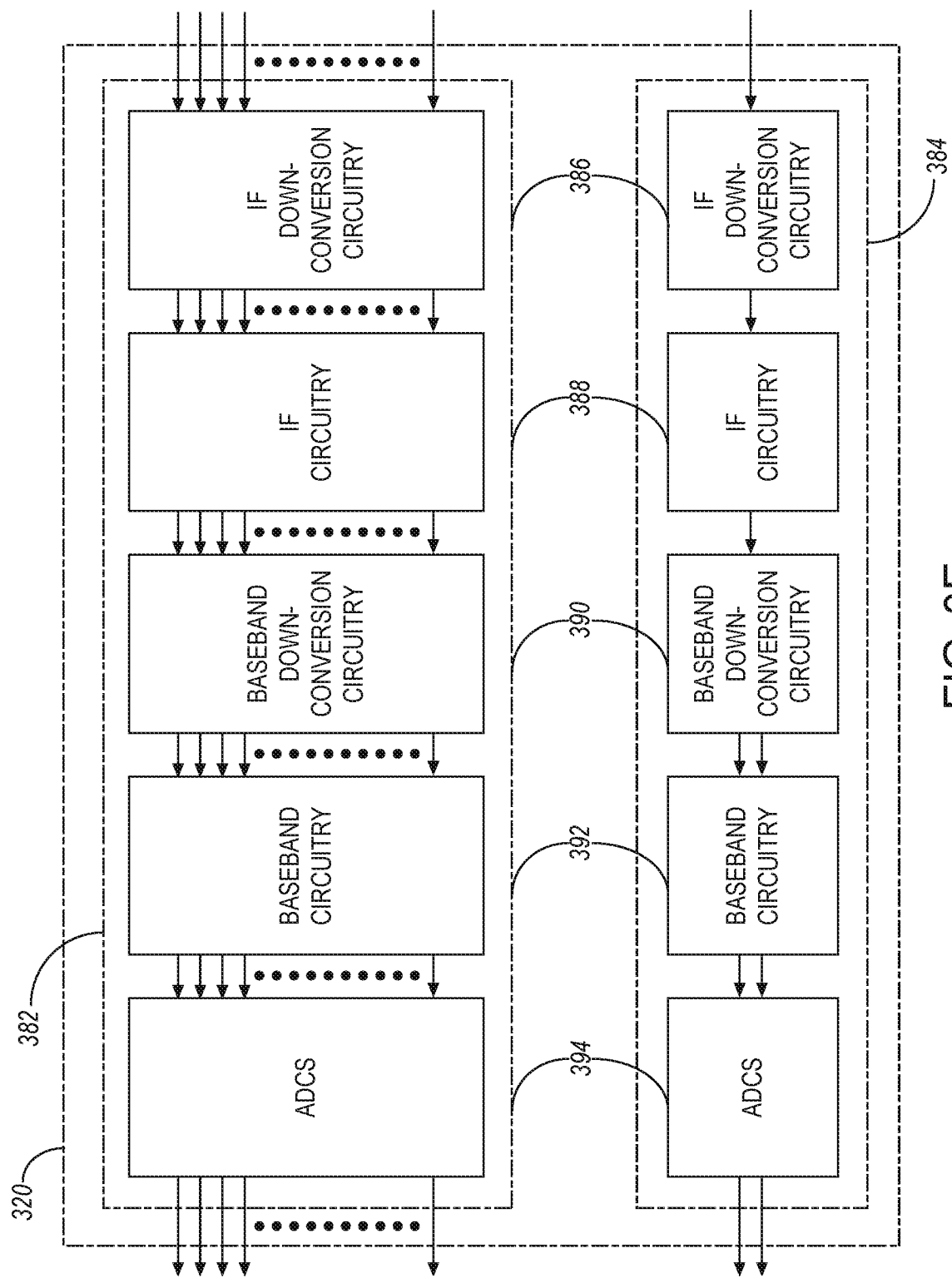
FIG. 3E illustrates aspects of exemplary receive circuitry in FIG. 3A according to some aspects.

FIG. 3A illustrates exemplary wireless communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Wireless communication circuitry 300 shown in FIG. 3A may be alternatively grouped according to functions. Components illustrated in FIG. 3A are provided here for illustrative purposes and may include other components not shown in FIG. 3A.

Wireless communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Wireless communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Wireless communication circuitry 300 may further include transmit circuitry 315, receive circuitry 320 and/or antenna array circuitry 330. Wireless communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

In some aspects, the wireless communication circuitry 300 can further include a PT tracking circuit 317A and a voltage regulator 319A. The PT tracking circuit 317A can include suitable circuitry, interfaces, and/or code and can be configured to receive a current reference signal 321A and generate a voltage reference signal (e.g., Vref) 323A. The voltage reference signal 323A can track PT variations as detected by one or more transistors within the PT tracking circuit 317A. Different techniques for implementing the PT tracking circuit 317A are discussed herein in reference to FIG. 11A-FIG. 15.

The voltage regulator 319A can include suitable circuitry, interfaces, and or code and can be configured to generate one or more voltage supply signals based on the voltage reference signal 323A. In some aspects, the voltage regulator 319A can be a low drop-out (LDO) regulator. In some aspects, the voltage regulator 319A can be configured to generate a voltage supply signals 327A, 329A, 331A, and 333A for one or more digital and/or analog circuits within the RF circuitry 325, the transmit circuitry 315, the receive circuitry 320, and a digital baseband circuitry 310, respectively. The voltage supply signals 327A, 329A, 331A, and 333A can be modulated based on the voltage reference signal 323A and, therefore, can also track PT variations as detected by the PT tracking circuit 317A.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more Intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

Figure 4:
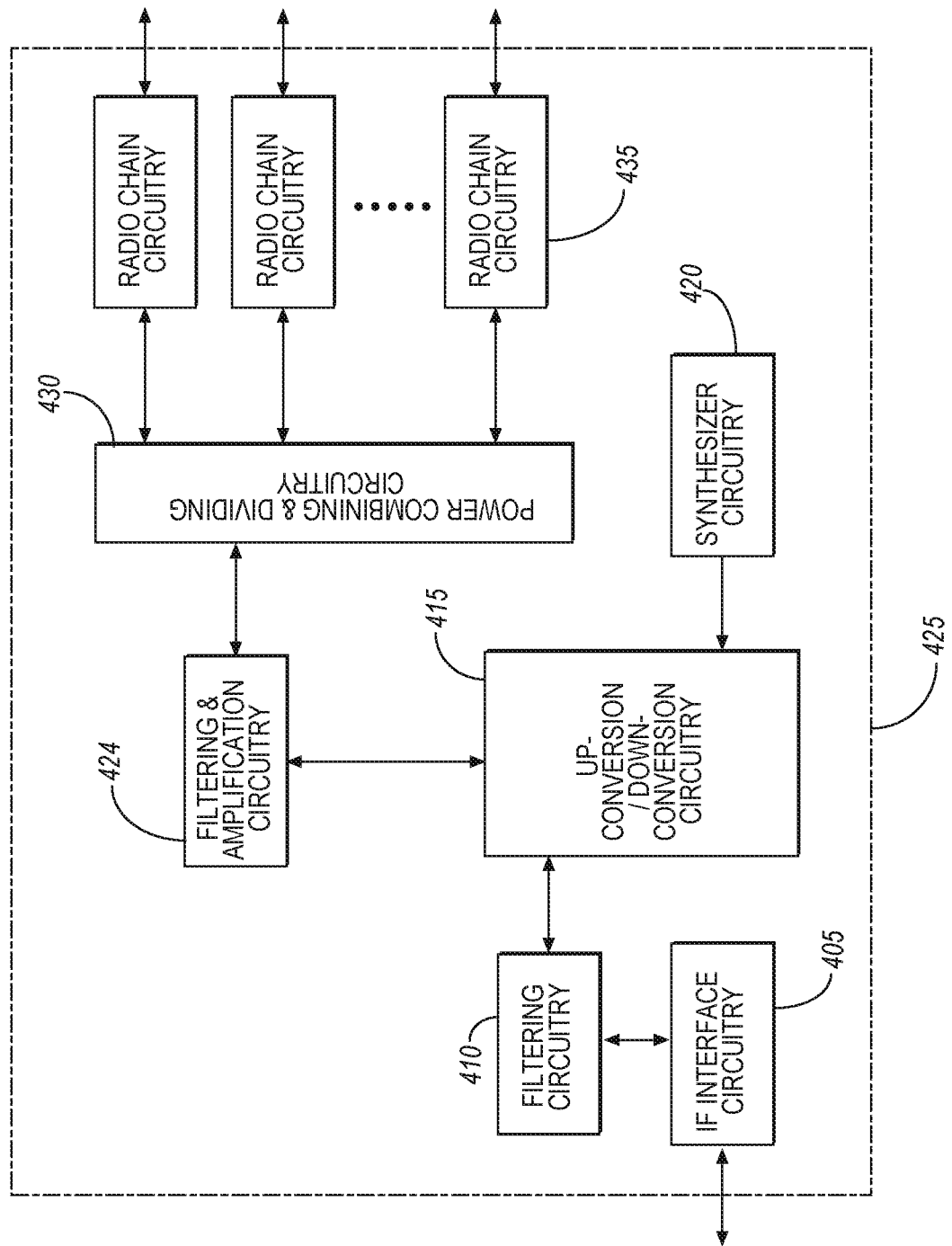
FIG. 4 illustrates exemplary useable RF circuitry in FIG. 3A according to some aspects.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

Figure 5B:
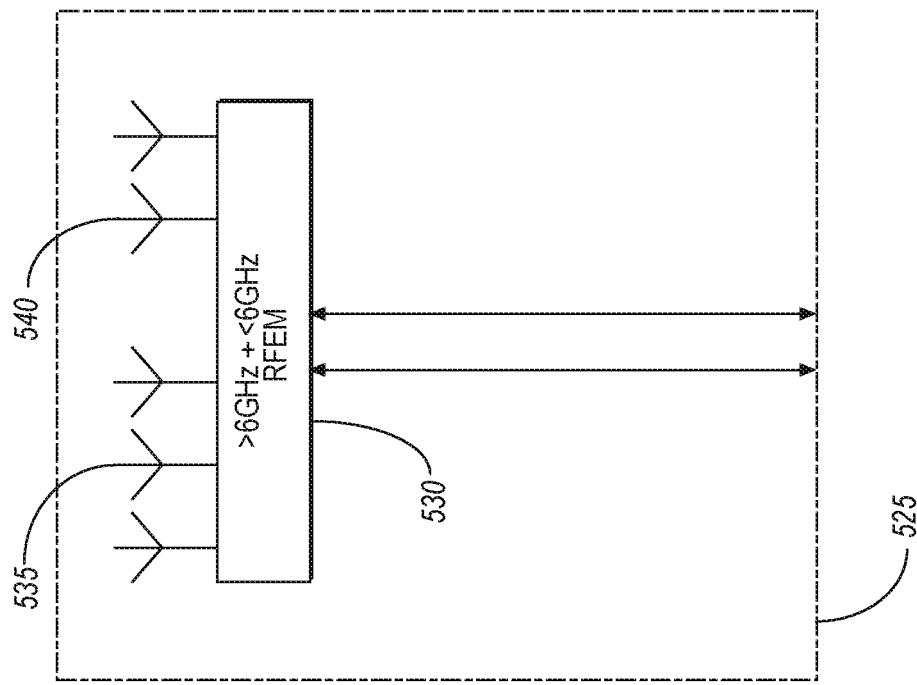
FIG. 5B illustrates an alternate aspect of an exemplary radio front end module, according to some aspects.
Figure 5A:
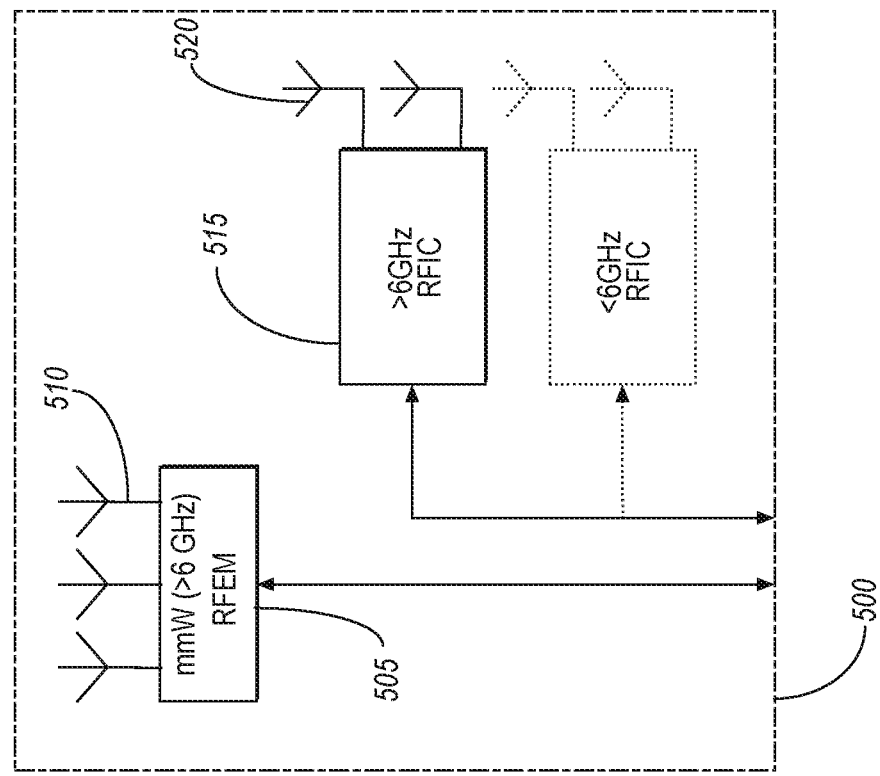
FIG. 5A illustrates an aspect of an exemplary radio front end module (RFEM) according to some aspects.

FIG. 5A and FIG. 5B illustrate aspects of a radio front-end module (RFEM) useable in the circuitry shown in FIG. 1 and FIG. 2, according to some aspects. FIG. 5A illustrates an aspect of a RFEM according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more above-six gigahertz RFICs 515 and/or one or more sub-six gigahertz RFICs 522 may be physically separated from millimeter wave RFEM 505. RFICs 515 and 522 may include connection to one or more antennas 520. RFEM SOS may include multiple antennas 510.

FIG. 5B illustrates an alternate aspect of a radio front end module, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
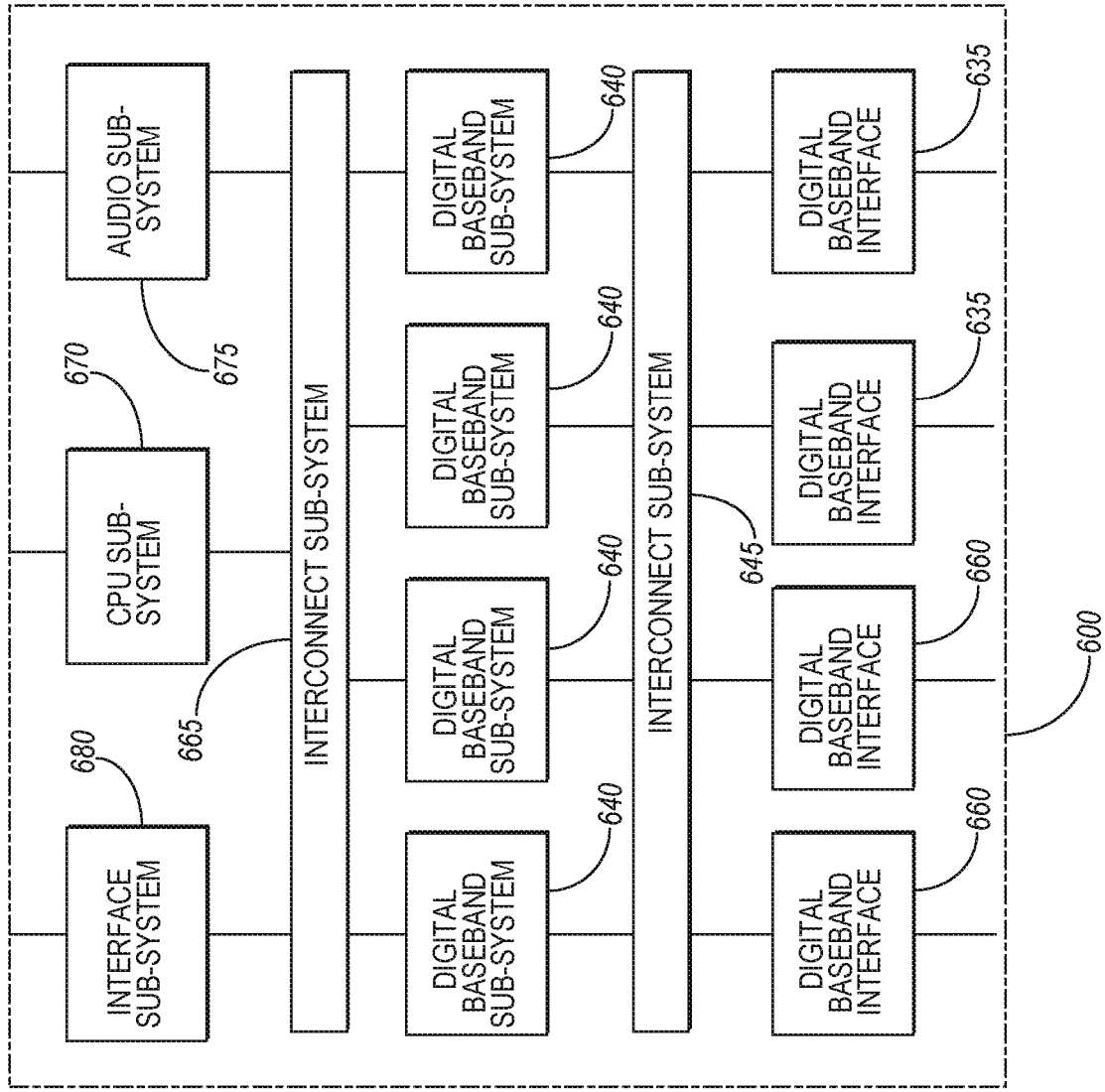
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NGC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
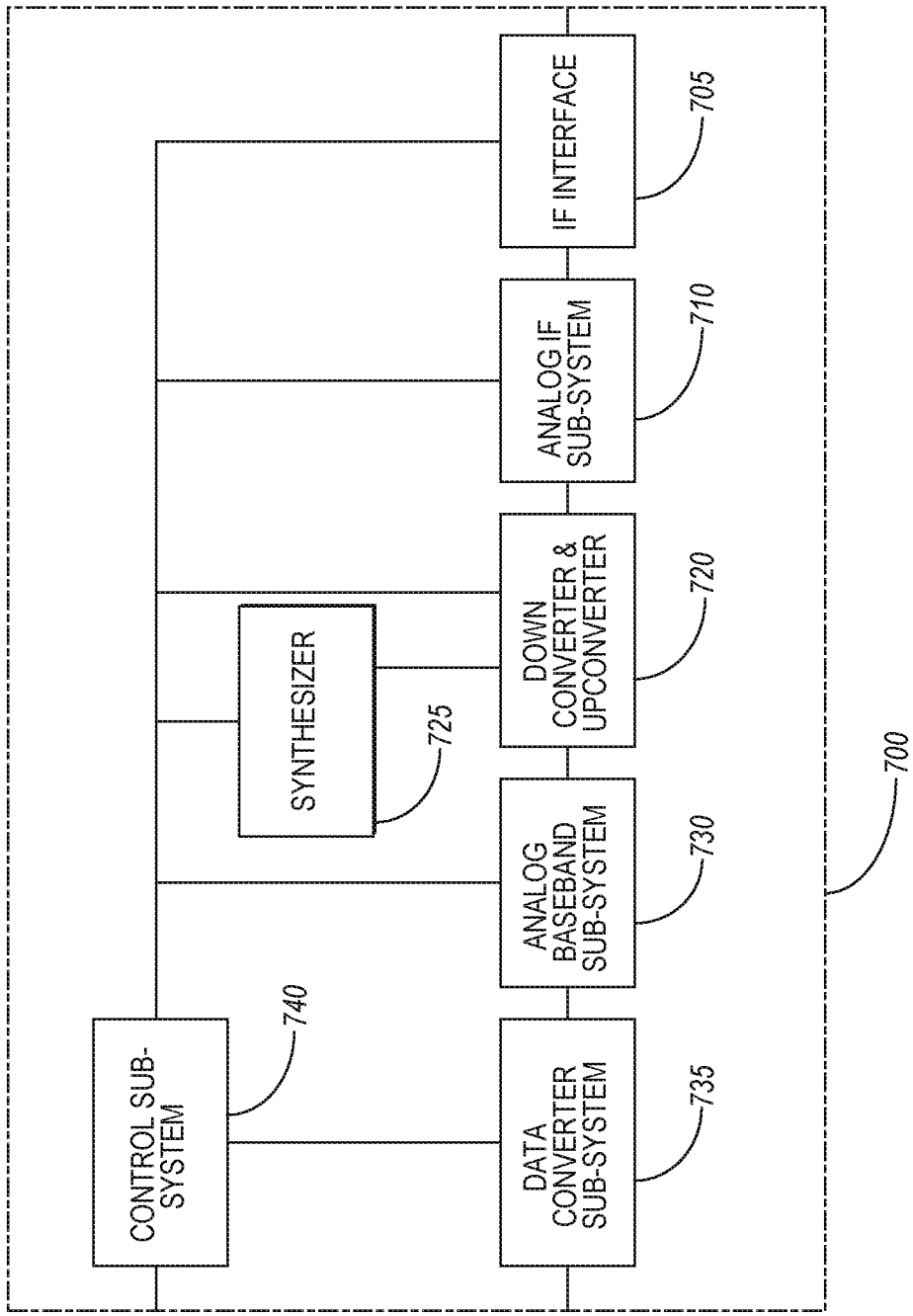
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
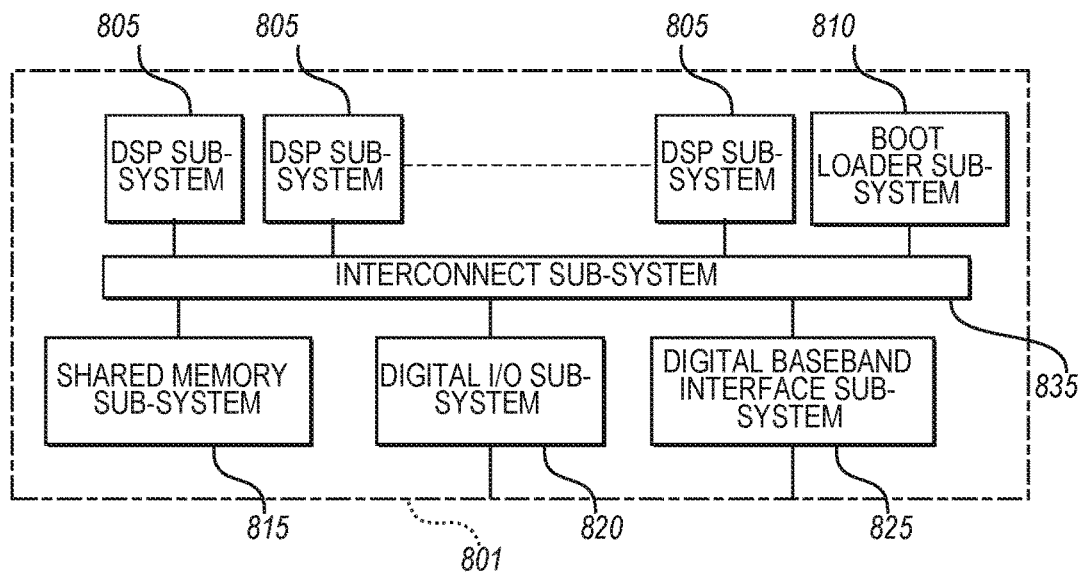
FIG. 8A illustrates an exemplary digital baseband subsystem, according to some aspects.
Figure 8B:
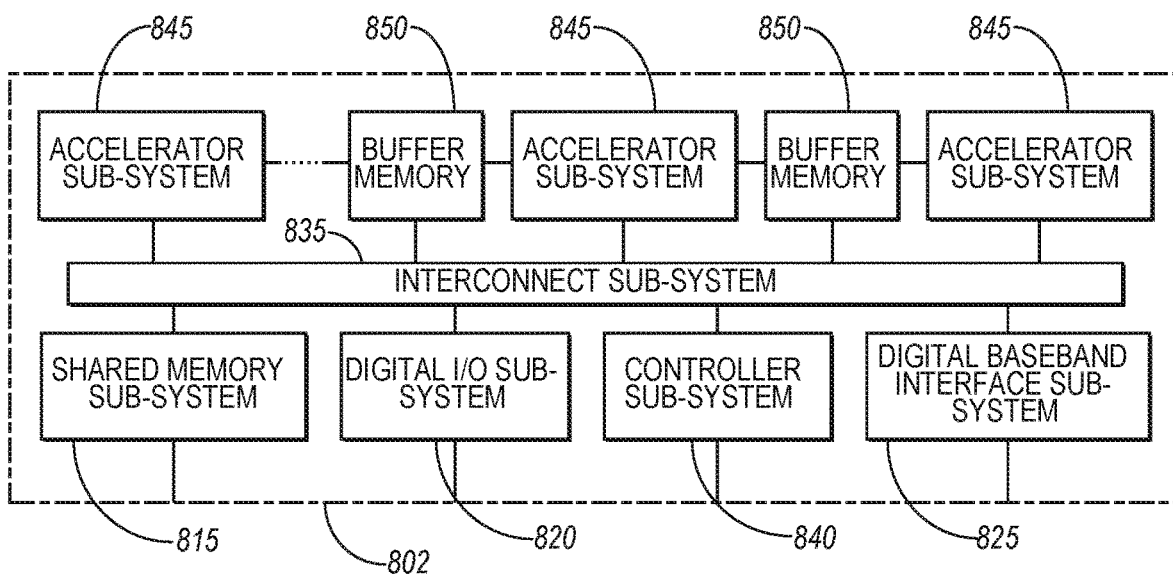
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I2C), Serial Peripheral Interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of: starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
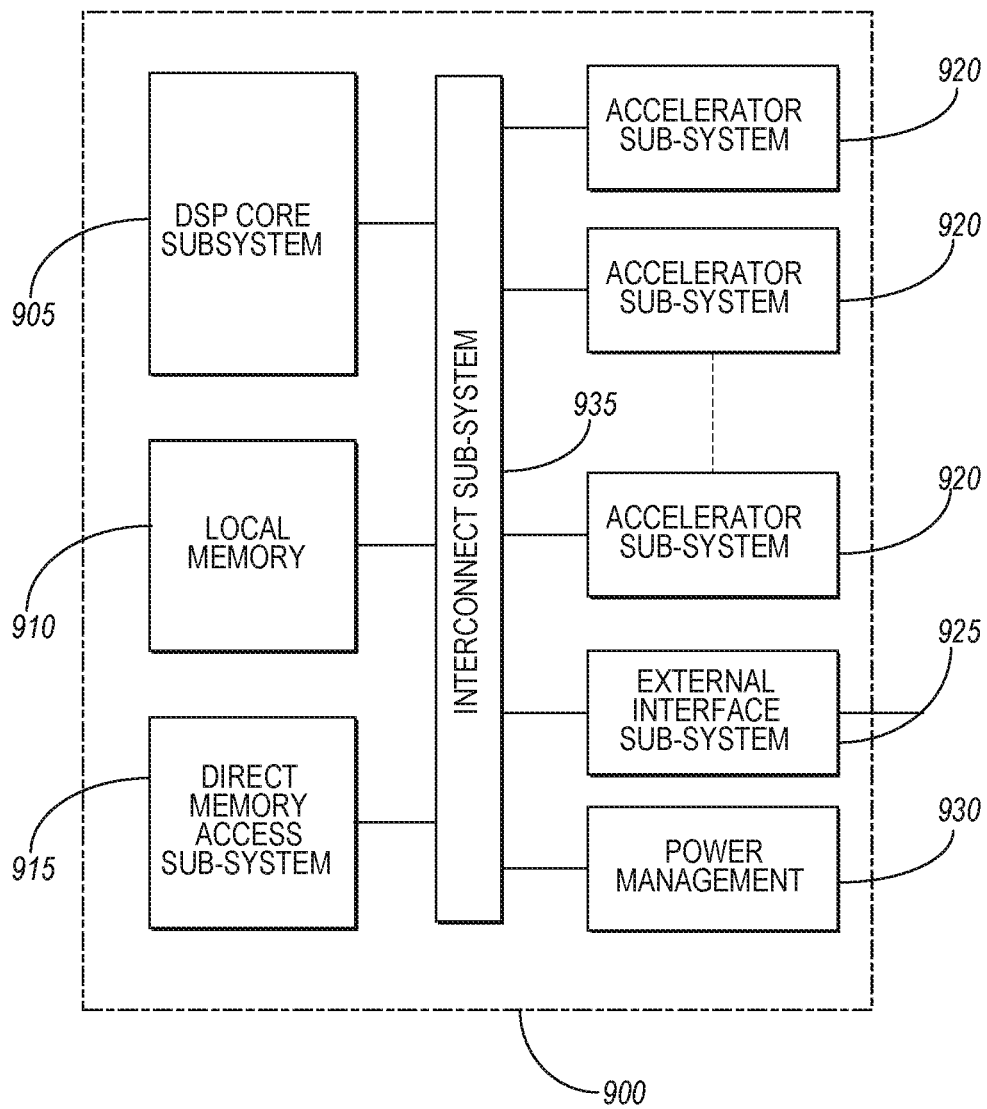
FIG. 9 illustrates an exemplary digital signal processor subsystem, according to some aspects.

FIG. 9 illustrates a digital signal processor (DSP) subsystem 900 according to some aspects. In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, the local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

Figure 10A:
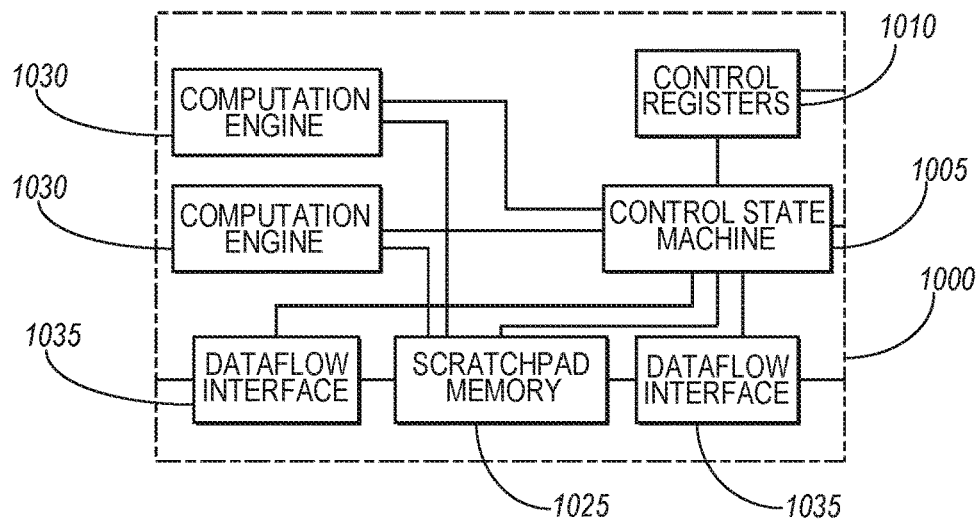
FIG. 10A illustrates an example of an accelerator subsystem, according to some aspects.
Figure 10B:
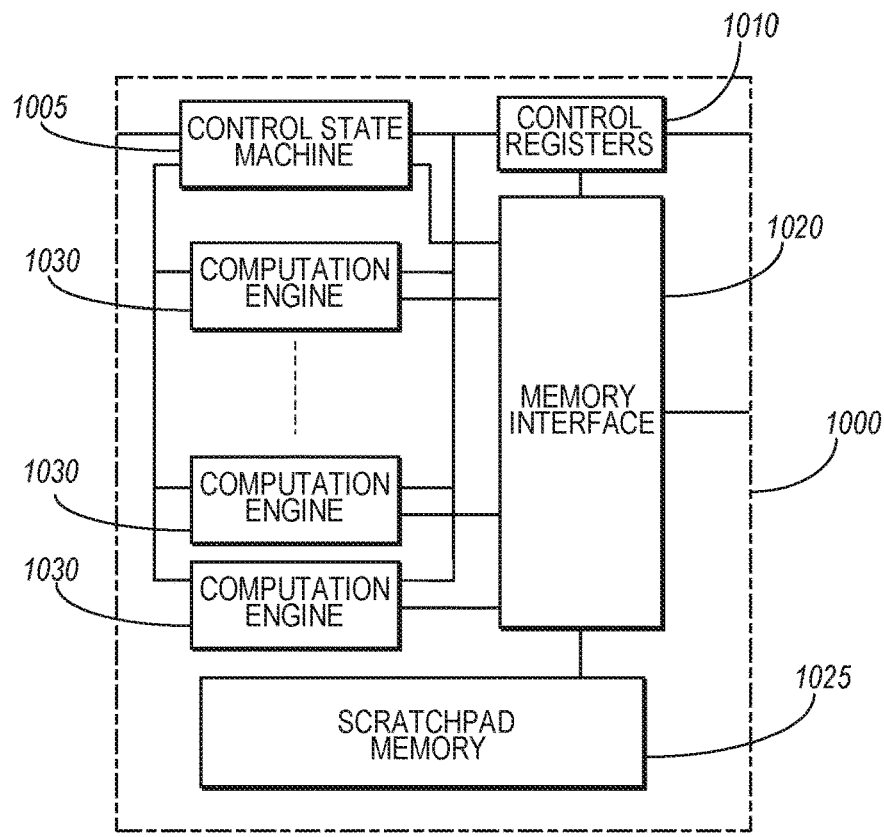
FIG. 10B illustrates an alternate exemplary accelerator subsystem, according to some aspects.

FIG. 10A illustrates an example of an accelerator subsystem 1000 according to some aspects. FIG. 10B illustrates an example of an accelerator subsystem 1000 according to some aspects.

In an aspect, accelerator subsystem 1000 may include one or more of each of control state machine 1005, control registers 1010, memory interface 1020, scratchpad memory 1025, computation engine 1030A . . . 1030N and dataflow interface 1035A, 1035B.

In an aspect, control registers 1010 may configure and control the operation of accelerator subsystem 1000, which may include one or more of enabling or disabling operation by means of an enable register bit, halting an in-process operation by writing to a halt register bit, providing parameters to configure computation operations, providing memory address information to identify the location of one or more control and data structures, configuring the generation of interrupts, or other control functions.

In an aspect, control state machine 1005 may control the sequence of operation of accelerator subsystem 1000.

Figure 11A:
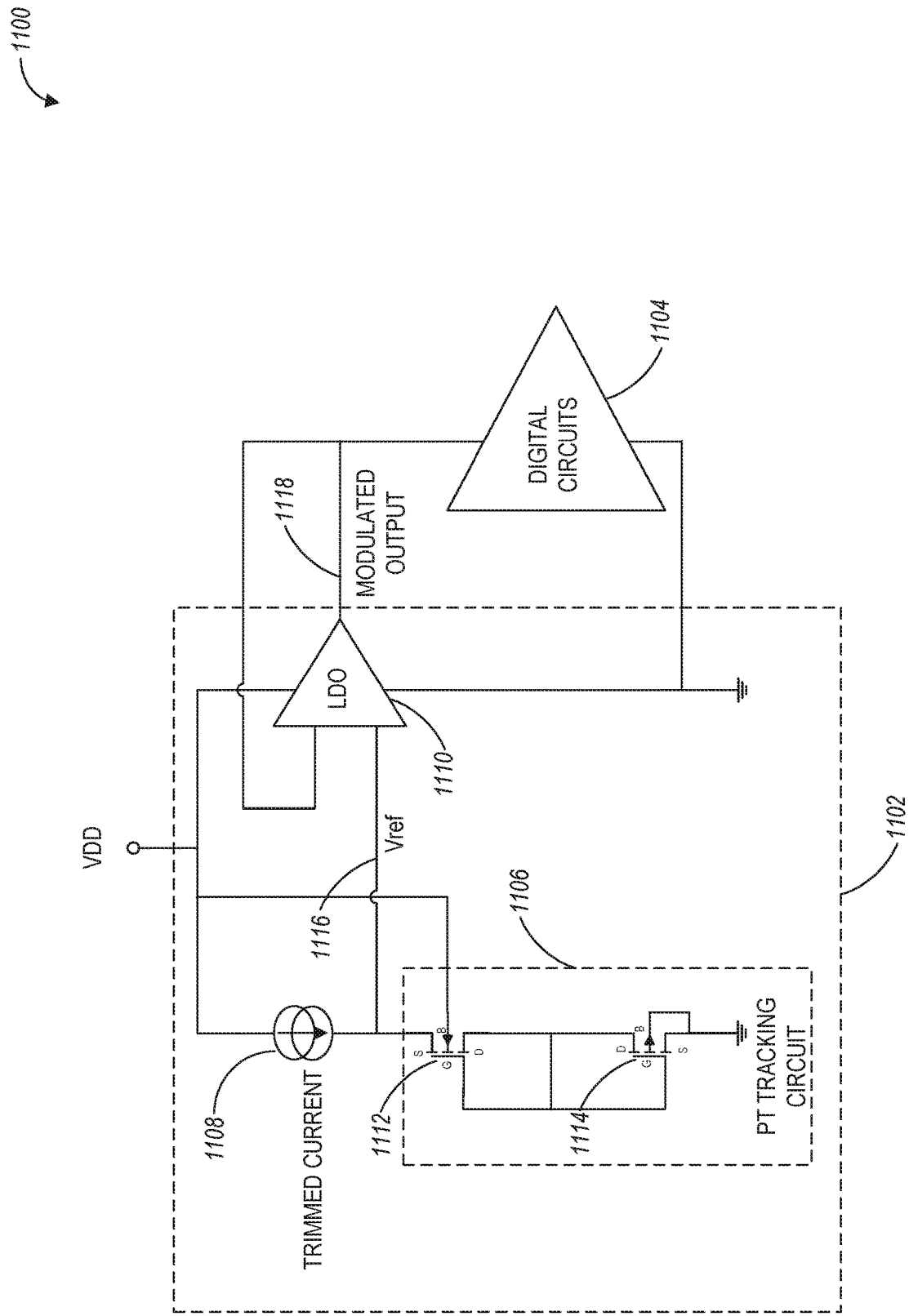
FIG. 11A illustrates a diagram of an example power supply circuitry using process and temperature tracking to modulate a voltage reference signal, in accordance with some aspects.

FIG. 11A illustrates a diagram of an example power supply circuitry using process and temperature tracking to modulate a voltage reference signal, in accordance with some aspects. Referring to FIG. 11A, there is illustrated signal processing circuitry 1100, which can include power supply circuitry 1102 and one or more digital circuits 1104. The power supply circuitry 1102 can include a PT tracking circuit 1106, a current source 1108, and a voltage regulator 1110. The digital circuits 1104 can include digital switching circuits, digital signal processing circuits, or other types of digital circuits within the communication device 300 of FIG. 3.

In some aspects, the PT tracking circuit 1106 can include transistors 1112 and 1114, which can be coupled in a self-biased inverter configuration. More specifically, transistor 1112 can be a field effect transistor such as a p-type metal-oxide-semiconductor (PMOS) transistor, and transistor 1114 can be a field effect transistor such as an n-type metal-oxide-semiconductor (NMOS) transistor. A source terminal and a bulk terminal of the PMOS 1112 can be connected to the current source 1108 and an upper voltage supply rail (Vdd), respectively. A drain terminal of the PMOS 1112 can be connected to a drain terminal of the NMOS 1114. Additionally, a bulk terminal and a source terminal of the NMOS 1114 can be connected to a lower voltage rail (e.g., ground), and a gate terminal of the PMOS 1112 can be connected to a gate terminal of the NMOS 1114. In some aspects, the two transistors 1112 and 1114 can be diode connected, e.g., via a feedback path coupling the gate-to-gate and drain-to-drain connections, as illustrated in FIG. 11A.

In some aspects, the voltage reference signal 1116 can be output from the PT tracking circuit 1106 at a node between the source terminal of the PMOS 1112 and the current source 1108, as illustrated in FIG. 11A. In this regard, the voltage reference signal 1116 can track process and temperature variations within the one or both of transistors 1112 and 1114 of the PT tracking circuit 1106.

Figure 11B:
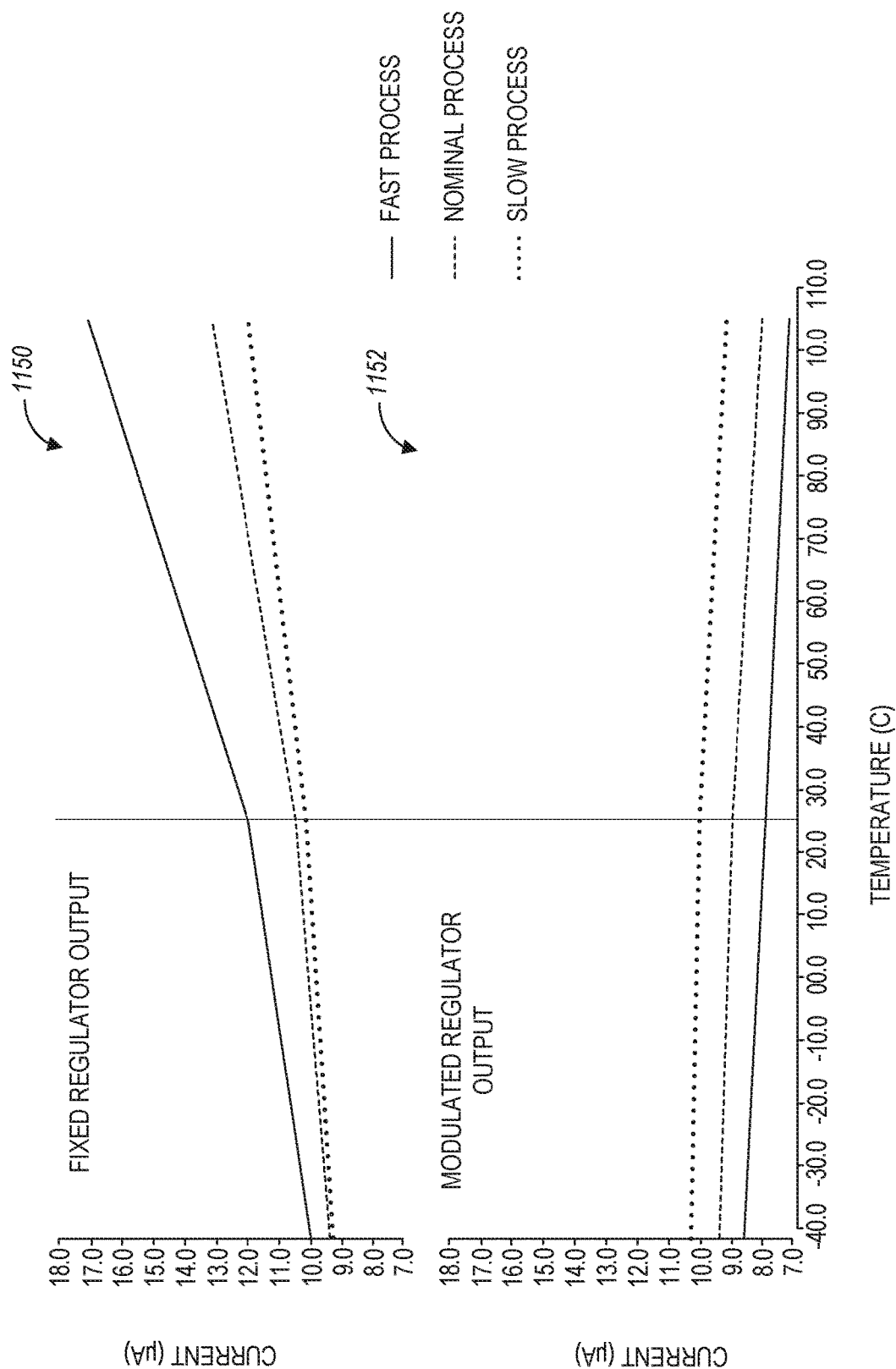
FIG. 11B illustrates example graphs of dynamic current over process versus temperature changes in connection with a modulated and non-modulated voltage reference signal generation, in accordance with some aspects.

The voltage regulator 1110 can include suitable circuitry, interfaces, and or code and can be configured to generate one or more voltage supply signals 1118 based on the voltage reference signal 1116. In some aspects, the voltage regulator 1110 can be a low drop-out (LDO) regulator. The voltage regulator 1110 can be configured to modulate the voltage supply signal 1118 based on the voltage reference signal 1116 and, consequently, the voltage supply signal 1118 also tracks PT variations detected by the PT tracking circuit 1106. In this regard, when the digital circuit 1104 uses voltage supply signal 1118 modulated on complementary metal-oxide-semiconductor (CMOS) process and temperature variations is detected by the PT tracking circuit 1106, switching current within the digital circuit 1104 can be controlled, without experiencing wide current variations (as seen in FIG. 11B).

FIG. 119 illustrates example graphs of dynamic current over process versus temperature changes in connection with a modulated and non-modulated voltage reference signal generation, in accordance with some aspects. Referring to FIG. 11B, graph 1150 illustrates example plots of dynamic current over process versus temperature for three different types of CMOS processes (e.g., a fast process, a nominal process, and a slow process), when a fixed voltage supply signal is used. As illustrated by graph 1150, the current within the digital circuit 1104 varies widely with the change of temperature and process.

In comparison, graph 1152 illustrates example plots of dynamic current over process versus temperature for the same types of CMOS processes, when a modulated voltage supply signal (e.g., 1118) is generated by the voltage regulator 1110 for use by the digital circuit 1104. As illustrated by graph 1152, the current within the digital circuit 1104 only slightly varies over process and temperature. In this regard, switching current within the digital circuit 1104 can be controlled because the modulated voltage output 1118 keeps CMOS transconductance constant and tracks PT variations. An additional benefit can be noted at nominal voltage regulator output, when the voltage supply signal can be lower to save further digital current because at nominal operation conditions, the digital circuit 1104 may use lower voltage (i.e., dv/dt is lower).

Figure 12:
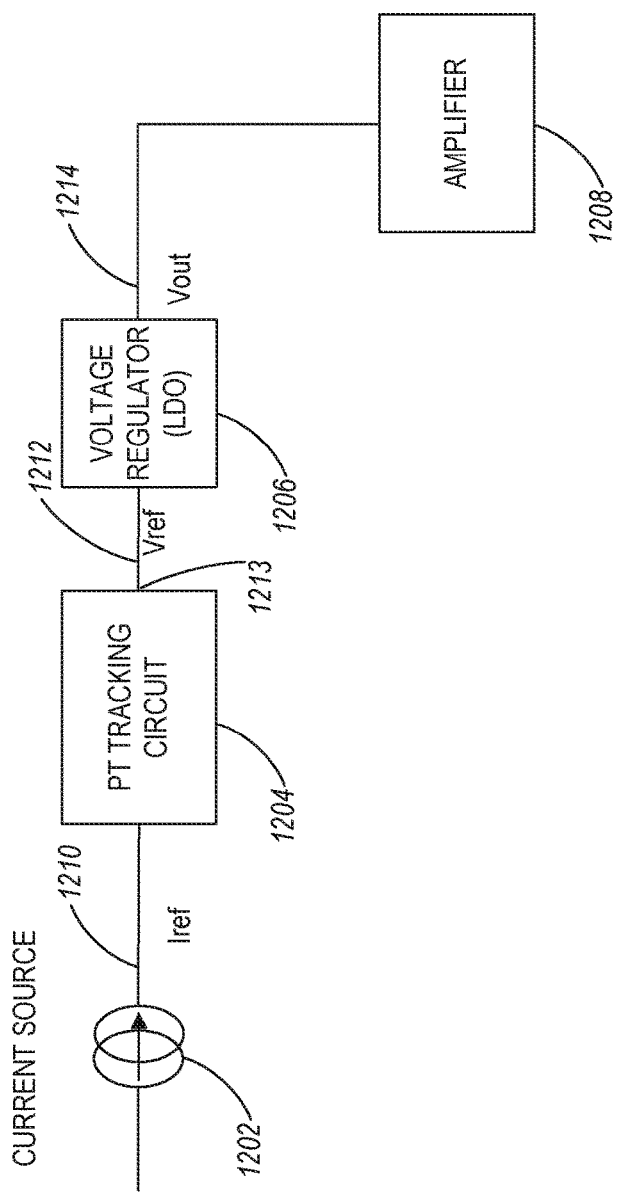
FIG. 12 illustrates an example signal processing system using process and temperature tracking circuit for modulating a voltage reference signal, in accordance with some aspects.

FIG. 12 illustrates an example signal processing system using process and temperature tracking circuit for modulating a voltage reference signal, in accordance with some aspects. Referring to FIG. 12, the example signal processing system 1200 can include a current source 1202, a PT tracking circuit 1204, a voltage regulator 1206, and an amplifier (or another analog circuit) 1208.

The PT tracking circuit 1204 can include suitable circuitry, interfaces, and/or code and can be configured to receive a current reference signal 1210 from the current source 1202, and generate a voltage reference signal (e.g., Vref) 1212 based on the current reference signal 1210. The voltage reference signal 1212 can track PT variations as detected by one or more transistors within the PT tracking circuit 1204.

The voltage regulator 1206 can include suitable circuitry, interfaces, and or code and can be configured to generate one or more voltage supply signals 1214 based on the voltage reference signal 1212. In some aspects, the voltage regulator 1206 can be a low drop-out (LDO) regulator, which can be configured to modulate the voltage supply signal 1214 based on the voltage reference signal 1212 and, therefore, can also track PT variations as detected by the PT tracking circuit 1204.

Conventional voltage regulators can generate a constant voltage supply signal, which can cause degradation in amplifier linearity as processing temperature changes. Such fixed voltage supply signal generation can require fusing/ trimming to maintain constant circuit performance or design in extreme margin to absorb PT variations, which results in increased use of silicon resources as well as increased cost and power requirements. In some aspects, by using a voltage supply signal 1214 which is modulated on processing temperature variations as detected by the PT tracking circuit 1204, a constant current can be maintained by the amplifier 1208 which also preserves the amplifier linearity.

In some aspects, the voltage reference signal 1212 can be generated as a fraction of the voltage supply signal 1214. In this regard, a voltage regulator with a closed-loop gain of higher than one can be used, resulting in improved stabilization of the voltage regulator 1206. For example, in some aspects, the voltage regulator 1206 can be configured with a closed-loop gain of 2 so that a voltage reference signal 1212 can be generated with a nominal value of one half of the voltage value associated with the voltage supply signal 1214. The voltage reference signal (Vref) 1212 can be output from an output node of the PT tracking circuit 1204, such as Vref node 1213. In some aspects, the voltage reference signal 1212 can be 550 mV while the voltage supply signal can be 1.1 V.

In accordance with techniques described herein, silicon and temperature variation can be tracked by generating a voltage reference signal for a voltage regulator functioning as the voltage supply signal generator for use by an amplifier. The voltage reference signal (e.g., 1212) is dependent and varies as process and/or temperature varies within the PT tracking circuit 1204, consequently moving the voltage supply signal 1214 at the output of the regulator 1206 based on such PT variations. The varying voltage supply signal 1214, therefore, maintains that linearity of amplifier 1208 constant. In this regard, by using PT tracking techniques and circuits disclosed herein, higher consistent performance, lower power consumption, cost, and complexity in digital and analog circuit design for a wireless device (or another type of communication device) can be improved. Additional benefits can be realized by specific PT tracking circuit design implementations, has disclosed herein. Furthermore, resulting in reduced gain variation can further help maintain consistent system performance.

Figure 13:
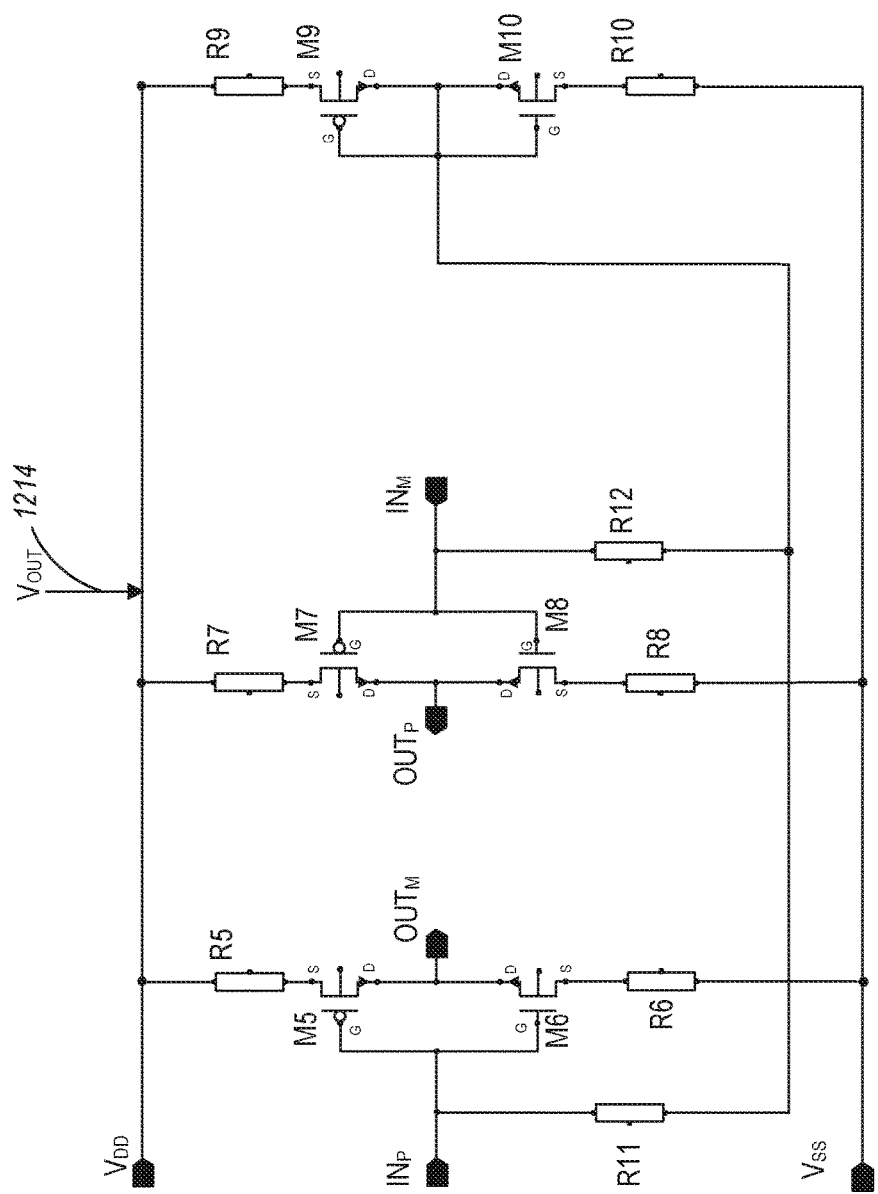
FIG. 13 illustrates an example amplifier circuit using a biasing circuit for partial compensation for processing temperature changes, in accordance with some aspects.

FIG. 13 illustrates an example amplifier circuit using a biasing circuit for partial compensation for processing temperature changes, in accordance with some aspects. Referring to FIG. 13, there is illustrated a schematic diagram of an example amplifier, such as amplifier 1208 of FIG. 12.

In some aspects, the amplifier 1208 can be a class AB degenerated inverter structure. The amplifier 1208 can include signal inputs INp and INm, and corresponding signal outputs OUTp and OUTm. The amplifier 1208 can further receive the voltage supply signal 1214, as illustrated in FIG. 13. Amplification of the input signals can be achieved via a pseudo-differential amplifier design, by using field effect transistors M5, M6, M7, and M8, and a biasing structure including transistors M9 and M10. The transistors M5 and M6 can be connected in series with resistors R5 and R6 between a high-voltage rail (Vdd) and a low voltage rail (Vss), as illustrated in FIG. 13. Similarly, amplification transistors M7 and M8 can be connected in series with resistors R7 and R8 between the Vdd and Vss rails, as illustrated in FIG. 13.

In some aspects, the biasing structure of amplifier 1208 can include transistors M9 and M10 coupled in series with resistors R9 and R10. The biasing structure of amplifier 1208 can further include resistors R11 and R12 coupled between the amplifier inputs and, nodes between the gate and drain terminals of transistors M9 and M10. As illustrated in FIG. 13, the biasing structure formed by transistors M9 and M10 as well as resistors R9 and R10 mimics the core amplifier design and can be configured to partially compensate for process and temperature variations within the amplifier 1208. In some aspects, transistors M5, M7, and M9 can be PMOS transistors, while transistors M6, M8, and M10 can be NMOS transistors. The biasing structure of amplifier 1208 can be a self-biased inverter with degenerative resistors R9 and R10, creating a gate voltage at the gates of transistors M5/M6 and M7/M8 via resistors R11 and R12.

Figure 14:
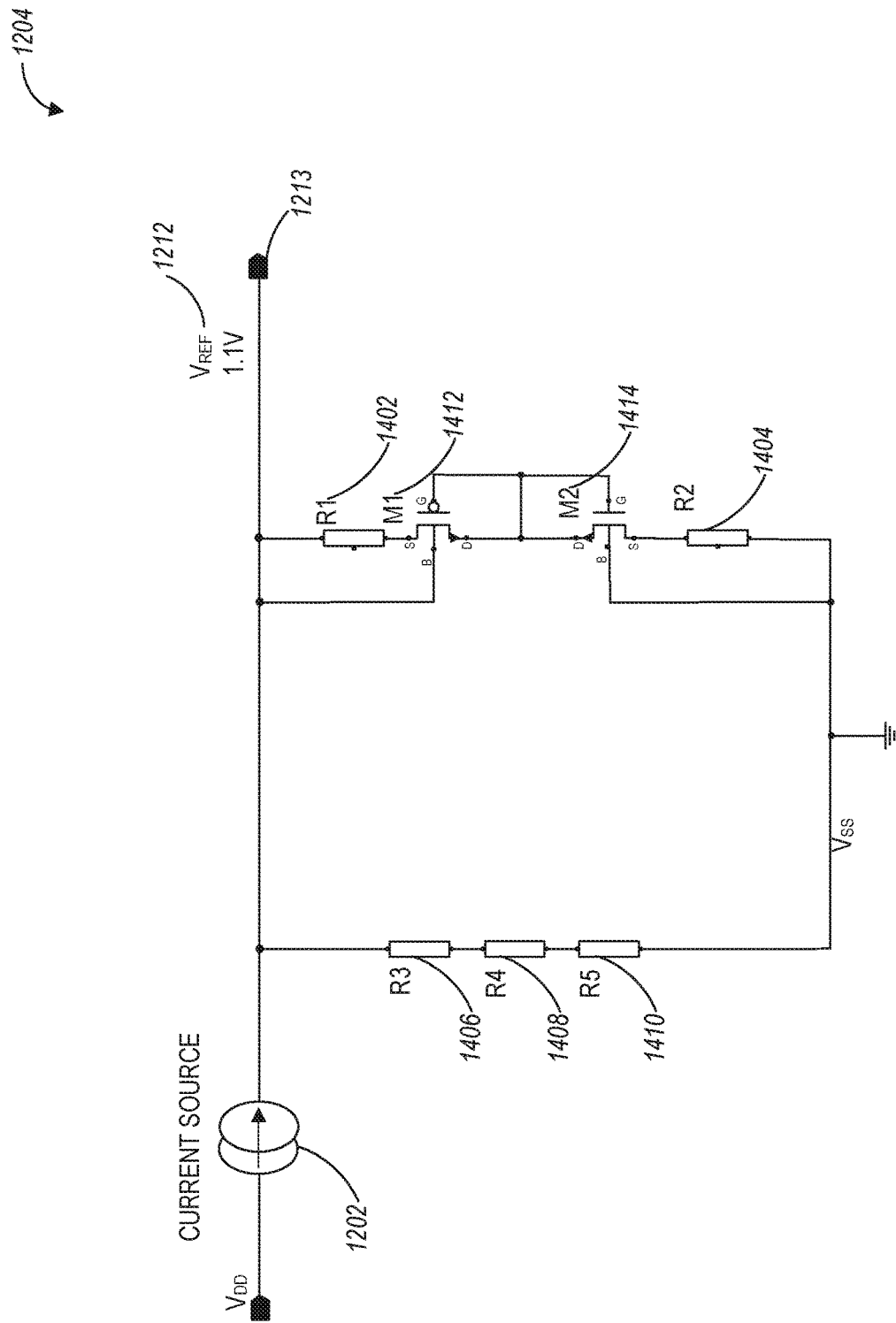
FIG. 14 illustrates an electric diagram of an example process and temperature tracking circuit, in accordance with some aspects.

FIG. 14 illustrates an electric diagram of an example process and temperature tracking circuit, in accordance with some aspects. Referring to FIG. 14, the example PT tracking circuit 1204 can include a current source 1202 coupled to a high-voltage rail Vdd, transistors M1 1412 and M2 1414, and resistors R1 (1402), R2 (1404), R3 (1406), R4 (1408), and R5 (1410). The transistors 1412 and 1414 can be field effect transistors of complementary type (e.g., transistor 1412 can be a PMOS transistor and transistor 1414 can be an NMOS transistor), but other types of transistors can be used as well. In some aspects, transistors 1412 and 1414 can be coupled in a self-biased, degenerated inverter configuration, with a drain—gate feedback. More specifically and as illustrated in FIG. 14, transistors 1412 and 1414 can be coupled in series with resistors 1402 and 1404 between the high-voltage rail Vdd and a low voltage rail Vss (e.g., ground). Additionally, transistors 1412 and 1414 can include mutually coupled drain terminals and mutually coupled gate terminals, with a feedback path between the gate and drain terminals. In some aspects, the bulk terminal and the source terminal of transistor 1412 can be coupled to the high-voltage rail Vdd or the Vref output node 1213, and the bulk terminal and source terminal of transistor 1414 can be coupled to the low voltage rail Vss. The PT tracking circuit 1204 can further include resistors 1406, 1408, and 1410 coupled between the Vref node 1213 and the low voltage rail Vss. The resistors 1406-1410 can be used for changing the temperature profile of the PT tracking circuit 1204 (e.g., by changing the resistor values).

In some aspects and as illustrated in FIG. 14, the PT tracking circuit 1204 topology mimics the circuit apology of amplifier 1208, as illustrated in FIG. 13. In some aspects, the PT tracking circuit 1204 in FIG. 14 is configured to generate a voltage reference signal 1212 at 1.1 V, which can be the same voltage supply level as provided by the voltage supply signal 1214 to the amplifier 1208. Put another way, the voltage regulator 1206 and the PT tracking circuit 1204 operates in the same supply level as the amplifier 1208, i.e., 1.1 V. Some drawbacks of this configuration include the following: the high voltage operation necessitates a current reference signal from an even higher current supply; the higher voltage operation of the PT tracking circuit 1204 can be inconsistent with voltage regulator design using voltage reference signal that is lower in value than the voltage supply signal generated by the voltage regulator; and, consequently, the high voltage operation of the PT tracking circuit 1204 in FIG. 14 can also necessitate voltage regulator and current source redesign. Furthermore, it can be more difficult to stabilize a voltage regulator with a closed loop gain of one (e.g., when the voltage regulator 1206 receives a reference voltage signal 1212 from the PT tracking circuit 1204 of FIG. 14, which is the same value as the voltage supply signal 1214), as opposed to a voltage regulator with a closed loop gain that is higher than one (e.g., a closed loop gain of two). In some aspects, one or more of the drawbacks described above associated with the PT tracking circuit 1204 in FIG. 14 can be overcome by using the PT tracking circuit 1204 as illustrated in FIG. 15.

Figure 15:
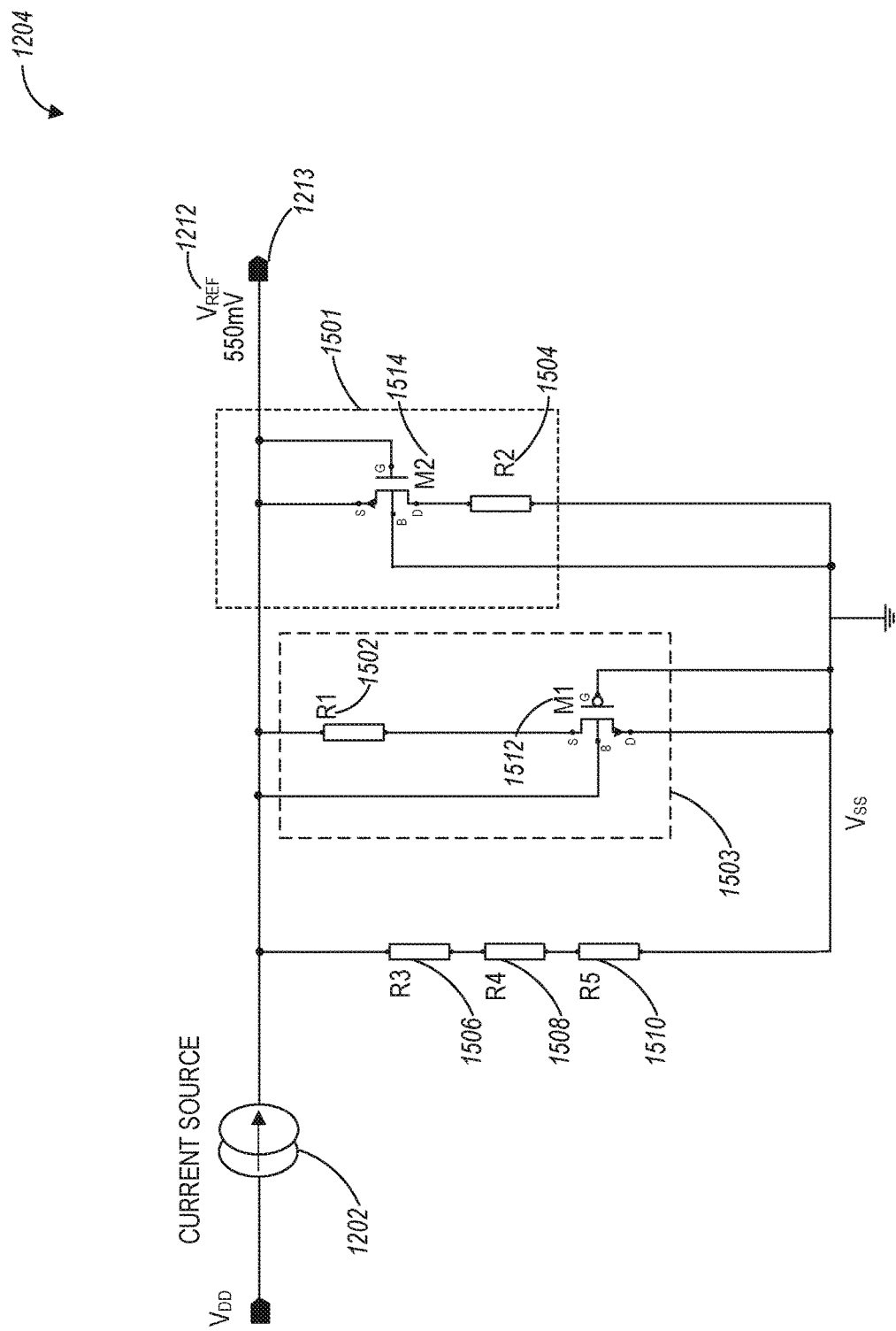
FIG. 15 illustrates an electric diagram of another example process and temperature tracking circuit, in accordance with some aspects.

FIG. 15 illustrates an electric diagram of another example process and temperature tracking circuit, in accordance with some aspects. Referring to FIG. 15, the example PT tracking circuit 1204 can include a current source 1202 coupled to the high-voltage rail Vdd, transistors M1 1512 and M2 1514, and resistors R1 (1502), R2 (1504), R3 (1506), R4 (1508), and R5 (1510). The transistors 1512 and 1514 can be field effect transistors of complementary type (e.g., transistor 1512 can be a PMOS transistor and transistor 1514 can be an NMOS transistor), but other types of transistors can be used as well.

In some aspects, the PT tracking circuit 1204 of FIG. 15 can be implemented using folded transistor design, mimicking an upper half 1503 (e.g. transistor 1412 and resistor 1402) and a lower half 1501 (e.g., transistor 1414 and resistor 1404) of the PT tracking circuit apology in FIG. 14, or the amplifier topology in FIG. 13 (e.g., upper half R9/M9 and lower half M10/R10 of the biasing circuit of amplifier 1208 in FIG. 13). More specifically, the upper half 1503 of the PT tracking circuit 1204 in FIG. 15 can include transistor 1512 coupled in series with the resistor 1502 between the Vref node 1213 and the low voltage rail Vss. Similarly, the lower half 1501 of the PT tracking circuit 1204 in FIG. 15 can include transistor 1514 and resistor 1504 coupled between the Vref node 1213 and the low voltage rail Vss. As illustrated in FIG. 15, each half (e.g., 1501 and 1503) of the PT tracking circuit 1204 in FIG. 15 appears in parallel, as opposed to in series as in the PT tracking circuit 1204 in FIG. 14 or the biasing circuit in amplifier 1208 in FIG. 13.

As illustrated in FIG. 15, a gate terminal and a drain terminal of transistor 1512 are coupled to the low voltage rail Vss, while a bulk terminal and a source terminal of transistor 1512 coupled to the Vref node 1213. Additionally, a bulk terminal and a drain terminal of transistor 1514 are coupled to the low voltage rail Vss, while a gate terminal and a source terminal of transistor 1514 are coupled to the Vref node 1213. The PT tracking circuit 1204 in FIG. 15 can further include resistors 1506, 1508, and 1510 coupled between the Vref node 1213 and the low voltage rail Vss. The resistors 1506-1510 can be used for changing the temperature profile of the PT tracking circuit 1204 (e.g., by changing the resistor values).

In some aspects, by using the folded PT tracking circuit design illustrated in FIG. 15, and lower output reference voltage 1212 can be achieved, with the output reference voltage 1212 tracking process and temperature variations in one or both of the transistors 1512 and 1514. As illustrated in FIG. 15, in some aspects, the output voltage reference signal 1212 can be 550 mV (which is one half of the 1.1 V value of the voltage signal 1214 supply to amplifier 1208). In other aspects, the PT tracking circuit 1204 in FIG. 15 can be configured to generate a voltage reference signal 1212 that is a different fraction of the voltage signal generated by the voltage regulator 1206. The lower voltage reference output 1212 overcomes the drawbacks associated with using a higher current reference signal (e.g., as used by the PT tracking circuit 1204 in FIG. 14). Additionally, the lower voltage reference output 1212 allows for using a voltage regulator with a closed-loop gain of two, which regulator can be easier to stabilize. A further benefit of avoiding back bias is achieved via the bulk terminal connection of transistor 1512 to the Vref node 1213.

Figure 16:
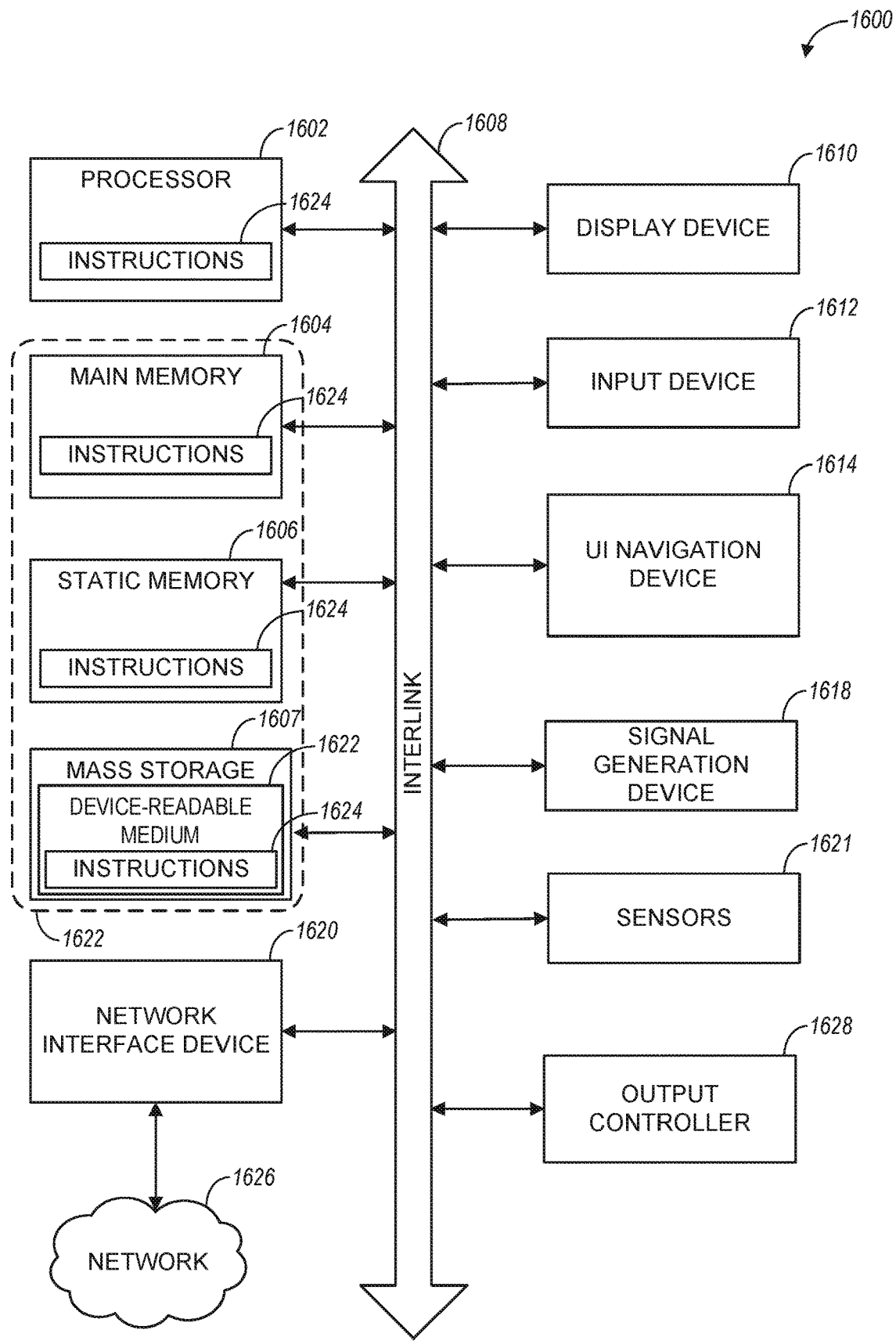
FIG. 16 illustrates a block diagram of a communication device such as an evolved Node-B (eNB), a new generation Node-B (gNB), an access point (AP), a wireless station (STA), a mobile station (MS), or a user equipment WE), in accordance with some aspects.

FIG. 16 illustrates a block diagram of a communication device 1600 such as an evolved Node-B (eNB), a new generation Node-B (gNB), an access point (AP), a wireless station (STA), a mobile station (MS), or a user equipment (UE), in accordance with some aspects. In alternative aspects, the communication device 1600 may operate as a standalone device or may be connected (e.g., networked) to other communication devices. In some aspects, the communication device 1600 can use one or more of the techniques and circuits discussed herein, in connection with any of FIG. 1-FIG. 15.

Circuitry (e.g., processing circuitry) is a collection of circuits implemented in tangible entities of the communication device 1600 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation.

In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the communication device 1600 follow.

In some aspects, the communication device 1600 may operate as a standalone device or may be connected (e.g., networked) to other devices. In a networked deployment, the communication device 1600 may operate in the capacity of a server communication device, a client communication device, or both in server-client network environments. In an example, the communication device 1600 may act as a peer communication device in peer-to-peer (P2P) (or other distributed) network environment. The communication device 1600 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device-readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., UE) 1600 may include a hardware processor 1602 (e.g., a central processing unit (CPU), a graphics processing unit (GPU), a hardware processor core, or any combination thereof), a main memory 1604, a static memory 1606, and mass storage 1616 (e.g., hard drive, tape drive, flash storage, or other block or storage devices), some or all of which may communicate with each other via an interlink (e.g., bus) 1608.

The communication device 1600 may further include a display unit 1610, an alphanumeric input device 1612 (e.g., a keyboard), and a user interface (UI) navigation device 1614 (e.g., a mouse). In an example, the display unit 1610, input device 1612 and UI navigation device 1614 may be a touch screen display. The communication device 1600 may additionally include a signal generation device 1618 (e.g., a speaker), a network interface device 1620, and one or more sensors 1621, such as a global positioning system (GPS) sensor, compass, accelerometer, or other sensor. The communication device 1600 may include an output controller 1628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1616 may include a communication device-readable medium 1622, on which is stored one or more sets of data structures or instructions 1624 (e.g., software) embodying or utilized by any one or more of the techniques or functions described herein. In some aspects, registers of the processor 1602, the main memory 1604, the static memory 1606, and/or the mass storage 1616 may be, or include (completely or at least partially), the device-readable medium 1622, on which is stored the one or more sets of data structures or instructions 1624, embodying or utilized by any one or more of the techniques or functions described herein. In an example, one or any combination of the hardware processor 1602, the main memory 1604, the static memory 1606, or the mass storage 1616 may constitute the device-readable medium 1622.

As used herein, the term "device-readable medium" is interchangeable with "computer-readable medium" or "machine-readable medium". While the communication device-readable medium 1622 is illustrated as a single medium, the term "communication device-readable medium" may include a single medium or multiple media (e.g., a centralized or distributed database, and/or associated caches and servers) configured to store the one or more instructions 1624.

The term "communication device-readable medium" may include any medium that is capable of storing, encoding, or carrying instructions for execution by the communication device 1600 and that cause the communication device 1600 to perform any one or more of the techniques of the present disclosure, or that is capable of storing, encoding or carrying data structures used by or associated with such instructions. Non-limiting communication device-readable medium examples may include solid-state memories, and optical and magnetic media. Specific examples of communication device-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, communication device-readable media may include non-transitory communication device-readable media. In some examples, communication device-readable media may include communication device-readable media that is not a transitory propagating signal.

The instructions 1624 may further be transmitted or received over a communications network 1626 using a transmission medium via the network interface device 1620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 1620 may include one or more physical jacks (e.g., Ethernet, coaxial, or phone jacks) or one or more antennas to connect to the communications network 1626. In an example, the network interface device 1620 may include a plurality of antennas to wirelessly communicate using at least one of single-input multiple-output (SIMO), or multiple-input single-output (MISO) techniques. In some examples, the network interface device 1620 may wirelessly communicate using Multiple User MIMO techniques.

The term "transmission medium" shall be taken to include any intangible medium that is capable of storing, encoding or carrying instructions for execution by the communication device 1600, and includes digital or analog communications signals or other intangible medium to facilitate communication of such software. In this regard, a transmission medium in the context of this disclosure is a device-readable medium.

Figure 17:
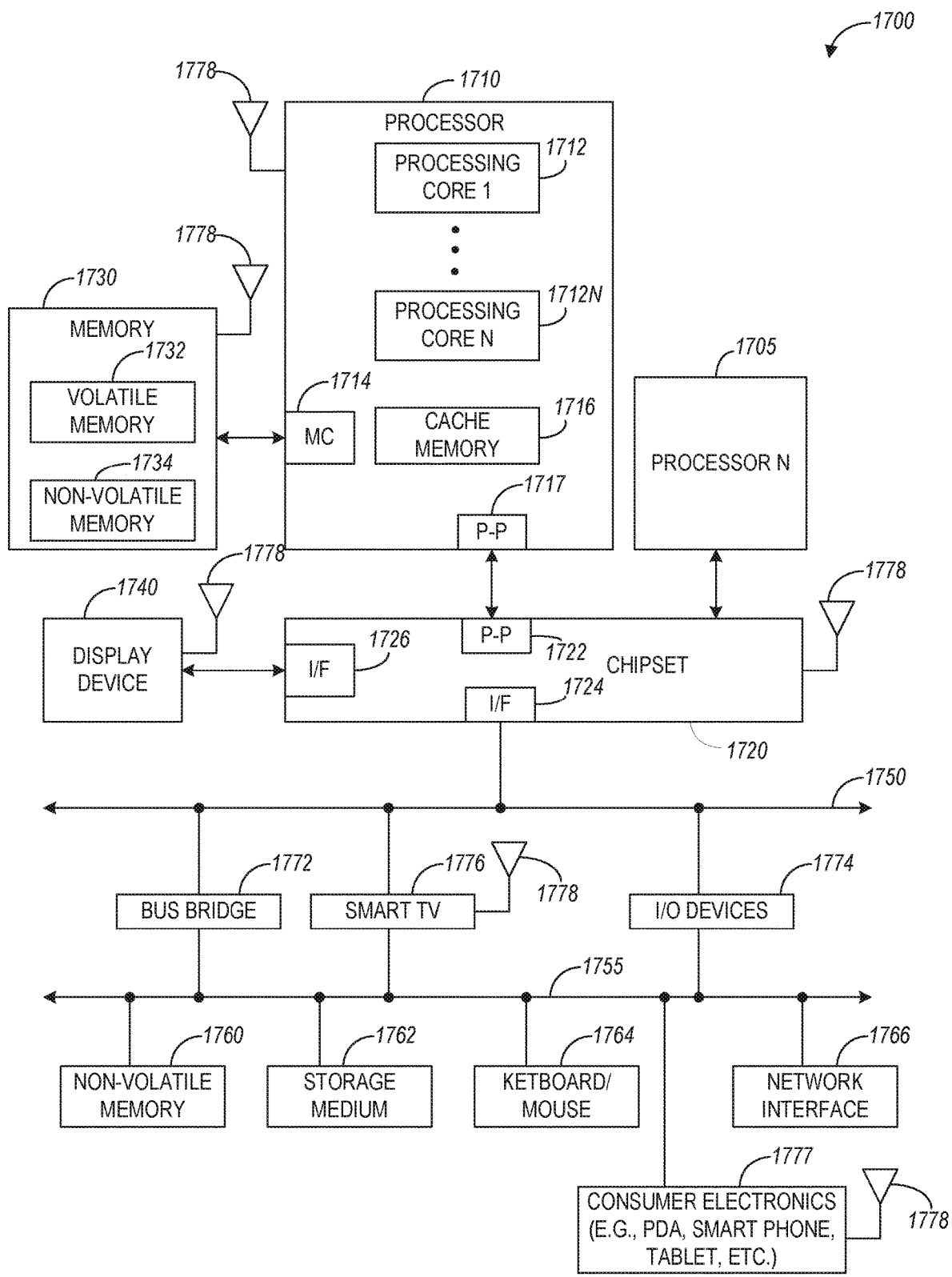
FIG. 17 illustrates a system level diagram, depicting an example of an electronic device (e.g., system) that can include, for example, a transmitter configured to selectively fan out a signal to one of multiple communication channels.

FIG. 17 illustrates a system level diagram, depicting an example of an electronic device (e.g., system) that can include, for example, a transmitter configured to selectively fan out a signal to one of multiple communication channels. FIG. 17 is included to show an example of a higher-level device application for the subject matter discussed above with regards to FIGS. 1-15. In one aspect, system 1700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some aspects, system 1700 is a system on a chip (SOC) system.

In one aspect, processor 1710 has one or more processor cores 1712, . . . , 1712N, where 1712N represents the Nth processor core inside processor 1710 where N is a positive integer. In one aspect, system 1700 includes multiple processors including 1710 and 1705, where processor 1705 has logic similar or identical to the logic of processor 1710. In some aspects, processing core 1712 includes, but is not limited to, pre-fetch logic to fetch instructions, decode logic to decode the instructions, execution logic to execute instructions and the like. In some aspects, processor 1710 has a cache memory 1716 to cache instructions and/or data for system 1700. Cache memory 1716 may be organized into a hierarchal structure including one or more levels of cache memory.

In some aspects, processor 1710 includes a memory controller 1714, which is operable to perform functions that enable the processor 1710 to access and communicate with memory 1730 that includes a volatile memory 1732 and/or a non-volatile memory 1734. In some aspects, processor 1710 is coupled with memory 1730 and chipset 1720. Processor 1710 may also be coupled to a wireless antenna 1778 to communicate with any device configured to transmit and/or receive wireless signals. In one aspect, an interface for wireless antenna 1778 operates in accordance with, but is not limited to, the IEEE 802.11 standard and its related family, Home Plug AV (HPAV), Ultra Wide Band (UWB), Bluetooth, WiMax, or any form of wireless communication protocol.

In some aspects, volatile memory 1732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1734 includes, but is not limited to, flash memory, phase change memory (PCM), read-only memory (ROM), electrically erasable programmable read-only memory (EEPROM), or any other type of non-volatile memory device.

Memory 1730 stores information and instructions to be executed by processor 1710. In one aspect, memory 1730 may also store temporary variables or other intermediate information while processor 1710 is executing instructions. In the illustrated aspect, chipset 1720 connects with processor 1710 via Point-to-Point (PtP or P-P) interfaces 1717 and 1722. Chipset 1720 enables processor 1710 to connect to other elements in system 1700. In some aspects of the example system, interfaces 1717 and 1722 operate in accordance with a PtP communication protocol such as the Intel® QuickPath interconnect (QPI) or the like. In other aspects, a different interconnect may be used.

In some aspects, chipset 1720 is operable to communicate with processor 1710, 1705N, display device 1740, and other devices, including a bus bridge 1772, a smart TV 1776, I/O devices 1774, nonvolatile memory 1760, a storage medium (such as one or more mass storage devices) 1762, a keyboard/mouse 1764, a network interface 1766, and various forms of consumer electronics 1777 (such as a PDA, smart phone, tablet etc.), etc. In one aspect, chipset 1720 couples with these devices through an interface 1724. Chipset 1720 may also be coupled to a wireless antenna 1778 to communicate with any device configured to transmit and/or receive wireless signals.

Chipset 1720 connects to display device 1740 via interface 1726. Display 1740 may be, for example, a liquid crystal display (LCD), a plasma display, cathode ray tube (CRT) display, or any other form of visual display device. In some aspects of the example system, processor 1710 and chipset 1720 are merged into a single SOC. In addition, chipset 1720 connects to one or more buses 1750 and 1755 that interconnect various system elements, such as I/O devices 1774, nonvolatile memory 1760, storage medium 1762, a keyboard/mouse 1764, and network interface 1766. Buses 1750 and 1755 may be interconnected together via a bus bridge 1772.

In one aspect, mass storage device 1762 includes, but is not limited to, a solid-state drive, a hard disk drive, a universal serial bus flash memory drive, or any other form of computer data storage medium. In one aspect, network interface 1766 is implemented by any type of well-known network interface standard including, but not limited to, an Ethernet interface, a universal serial bus (USB) interface, a Peripheral Component interconnect (PCI) Express interface, a wireless interface and/or any other suitable type of interface. In one aspect, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 17 are depicted as separate blocks within the system 1700, the functions performed by some of these blocks may be integrated within a single semiconductor circuit or may be implemented using two or more separate integrated circuits. For example, although cache memory 1716 is depicted as a separate block within processor 1710, cache memory 1716 (or selected aspects of 1716) can be incorporated into processor core 1712.

Additional Notes and Aspects

Example 1 is an apparatus, comprising: tracking circuitry coupled to a current source and configured to generate a reference voltage signal based on a reference current signal from the current source; voltage regulator circuitry coupled to the tracking circuitry and configured to generate a voltage supply signal based on the reference voltage signal; and amplifier circuitry configured to amplify an input signal based on the voltage supply signal; wherein the reference voltage signal tracks process and temperature variations associated with at least one field effect transistor within the tracking circuitry, and the voltage regulator circuitry is configured to operate with a closed loop gain higher than 1.

In Example 2, the subject matter of Example 1 includes, wherein the tracking circuitry comprises a first transistor connected in parallel with a second transistor, the first and second transistors having a complimentary type with each other.

In Example 3, the subject matter of Example 2 includes, wherein the first transistor is an n-type metal-oxide-semiconductor (NMOS) transistor, and the second transistor is a p-type metal-oxide-semiconductor (PMOS) transistor.

In Example 4, the subject matter of Example 3 includes, wherein the NMOS transistor is coupled in series with a first resistor, between a node of the reference voltage signal and a low voltage rail.

In Example 5, the subject matter of Example 4 includes, wherein the PMOS transistor is coupled in series with a second resistor, between the node of the reference voltage signal and the low voltage rail.

In Example 6, the subject matter of Example 5 includes, wherein the PMOS transistor is diode connected, with its gate terminal coupled to its drain terminal and the low voltage rail.

In Example 7, the subject matter of Example 6 includes, wherein: a source terminal of the PMOS transistor is coupled to the node of the reference voltage signal via the second resistor; and a bulk terminal of PMOS transistor is coupled to the node of the reference voltage signal.

In Example 8, the subject matter of Examples 6-7 includes, wherein: a drain terminal of the NMOS transistor is coupled to the low voltage rail via the first resistor; and a bulk terminal of NMOS transistor is coupled to the low voltage rail.

In Example 9, the subject matter of Examples 5-8 includes, wherein the tracking circuitry further comprises: at least a third resistor coupled in series between the node of the reference voltage signal and the low voltage rail.

In Example 10, the subject matter of Examples 4-9 includes, wherein the NMOS transistor is diode connected, with its gate terminal coupled to its source terminal and the node of the reference voltage signal.

In Example 11, the subject matter of Examples 1-10 includes, wherein the tracking circuitry is configured to generate the reference voltage signal as a fraction of the voltage supply signal.

In Example 12, the subject matter of Example 11 includes, wherein: the voltage regulator circuitry is configured to operate with a closed loop gain of 2; the voltage supply signal is 1.1 volts (V); and the reference voltage signal is 550 millivolts (mV).

In Example 13, the subject matter of Examples 1-12 includes, wherein the amplifier circuitry comprises a plurality of transistors configured as a biased, degenerated inverter.

In Example 14, the subject matter of Examples 1-13 includes, wherein the amplifier circuitry comprises a biasing circuit including at least a first field effect transistor and a second field effect transistor.

In Example 15, the subject matter of Example 14 includes, wherein a gate of the first field effect transistor is coupled to a drain of the first field effect transistor, a gate of the second field effect transistor and a drain of the second field effect transistor.

Example 16 is a wireless communication device, comprising: an antenna array configured to receive a plurality of radio frequency (RF) signals; RF circuitry configured to amplify the plurality of RF signals received via the antenna array to generate one or more amplified RF signal; digital baseband circuitry coupled to the RF circuitry and configured to generate a digital output signal for processing by a wireless modem, the digital output signal based on the one or more amplified RF signals; and power supply circuitry coupled to the RF circuitry and the digital baseband circuitry, the power supply circuitry configured to generate a voltage supply signal for the RF circuitry and the digital baseband circuitry based on a reference voltage signal, wherein the reference voltage signal tracks process and temperature variations within the wireless communication device.

In Example 17, the subject matter of Example 16 includes, wherein: the digital baseband circuitry is further configured to receive the voltage supply signal from the power supply circuitry, receive a digital signal from the wireless modem, and generate an RF signal based on the digital signal and the voltage supply signal; the RF circuitry is configured to amplify the RF signal using amplification circuitry, to generate an amplified RF signal for transmission via the antenna array; and the power supply circuitry is configured to generate the reference voltage signal tracking the process and temperature variations as a fraction of the voltage supply signal.

In Example 18, the subject matter of Examples 16-17 includes, wherein the power supply circuitry comprises: a current source configured to generate a reference current signal; process and temperature tracking circuitry configured to generate the reference voltage signal based on the reference current signal; and voltage regulator circuitry configured to generate the voltage supply signal based on the reference voltage signal.

In Example 19, the subject matter of Example 18 includes, wherein the voltage regulator circuitry is configured to modulate the voltage supply signal on the reference voltage signal.

In Example 20, the subject matter of Examples 18-19 includes, wherein the process and temperature tracking circuitry comprises: a first metal-oxide-semiconductor field-effect transistor (MOSFET) electrically coupled in series with a second MOSFET.

In Example 21, the subject matter of Example 20 includes, wherein a drain terminal the first MOSFET is coupled to a drain terminal of the second MOSFET.

In Example 22, the subject matter of Example 21 includes, wherein the first MOSFET is diode-connected, with its gate terminal being coupled to its drain terminal.

In Example 23, the subject matter of Examples 21-22 includes, wherein the second MOSFET is diode-connected, with its gate terminal being coupled to its drain terminal.

In Example 24, the subject matter of Examples 20-23 includes, wherein the first MOSFET and the second MOSFET are coupled in a complementary metal-oxide-semiconductor (CMOS) inverter configuration.

In Example 25, the subject matter of Example 24 includes, wherein: a source terminal of the first MOSFET is coupled to the current source; and a bulk terminal and a source terminal of the second MOSFET coupled to ground.

In Example 26, the subject matter of Example 25 includes, wherein the source terminal of the first MOSFET is further configured to supply at least a portion of the reference voltage signal to the voltage regulator circuitry.

In Example 27, the subject matter of Examples 18-26 includes, wherein the voltage regulator circuitry is a low dropout (LDO) voltage regulator configured to generate the voltage supply signal for one or more digital circuits within the digital baseband circuitry.

Example 28 is a voltage supply apparatus, comprising: a current source coupled to a rail voltage source and configured to generate a reference current signal; tracking circuitry coupled to the current source and configured to generate a reference voltage signal based on the reference current signal, wherein the tracking circuitry comprises a plurality of field effect transistors coupled in series to form a self-biased inverter; and voltage regulator circuitry coupled to the tracking circuitry and configured to generate a voltage supply signal based on the reference voltage signal.

In Example 29, the subject matter of Example 28 includes, wherein the reference voltage signal tracks process and temperature variations associated with one or more of the plurality of field effect transistors.

In Example 30, the subject matter of Examples 28-29 includes, wherein the plurality of field effect transistors comprises: a first field effect transistor having its source terminal coupled to the current source and its bulk terminal coupled to the rail voltage source; and a second field effect transistor having its source and bulk terminals coupled to ground, and having its drain terminal coupled to a drain terminal of the first field effect transistor.

In Example 31, the subject matter of Example 30 includes, wherein a gate terminal of the first field effect transistor is coupled to a gate terminal of the second field effect transistor.

In Example 32, the subject matter of Examples 30-31 includes, wherein the first field effect transistor is a p-type metal-oxide-semiconductor (PMOS) transistor, and the second field effect transistor is an n-type metal-oxide-semiconductor (NMOS) transistor.

In Example 33, the subject matter of Example 32 includes, wherein: the PMOS transistor is diode-connected, with its gate terminal being coupled to its drain terminal; and the NMOS transistor is diode-connected, with its gate terminal being coupled to its drain terminal.

In Example 34, the subject matter of Examples 30-33 includes, wherein the voltage regulator circuitry is configured to receive the reference voltage signal via a node coupled to the current source and a source terminal of the first field effect transistor.

In Example 35, the subject matter of Examples 30-34 includes, wherein the reference voltage signal tracks process and temperature variations in one or both of the first field effect transistor and the second field effect transistor.

In Example 36, the subject matter of Examples 28-35 includes, wherein the voltage regulator circuitry is a low dropout (LDO) voltage regulator configured to generate the voltage supply signal for one or more digital circuits using the reference voltage signal.

Example 37 is at least one machine-readable medium including instructions that, when executed by processing circuitry, cause the processing circuitry to perform operations to implement of any of Examples 1-36.

Example 38 is an apparatus comprising means to implement of any of Examples 1-36.

Example 39 is a system to implement of any of Examples 1-36.

Example 40 is a method to implement of any of Examples 1-36.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or permutations. The scope of the invention should be determined with reference to the appended claims, along with the fill scope of equivalents to which such claims are legally entitled.

What is claimed is:
1. An apparatus, comprising:
   tracking circuitry coupled to a current source and configured to generate a reference voltage signal based on a reference current signal from the current source;
   voltage regulator circuitry coupled to the tracking circuitry and configured to generate a voltage supply signal based on the reference voltage signal; and
   amplifier circuitry configured to amplify an input signal based on the voltage supply signal;
   wherein the reference voltage signal tracks process and temperature variations associated with at least one field effect transistor within the tracking circuitry, and the voltage regulator circuitry is configured to operate with a closed loop gain higher than 1.
2. The apparatus of claim 1, wherein the tracking circuitry comprises a first transistor connected in parallel with a second transistor, the first and second transistors having a complimentary type with each other.
3. The apparatus of claim 2, wherein the first transistor is an n-type metal-oxide-semiconductor (NMOS) transistor, and the second transistor is a p-type metal-oxide-semiconductor (PMOS) transistor.
4. The apparatus of claim 3, wherein the NMOS transistor is coupled in series with a first resistor, between a node of the reference voltage signal and a low voltage rail.

5. The apparatus of claim 4, wherein the PMOS transistor is coupled in series with a second resistor, between the node of the reference voltage signal and the low voltage rail.

6. The apparatus of claim 5, wherein the PMOS transistor is diode connected, with its gate terminal coupled to its drain terminal and the low voltage rail.

7. The apparatus of claim 6, wherein:
a source terminal of the PMOS transistor is coupled to the node of the reference voltage signal via the second resistor; and
a bulk terminal of PMOS transistor is coupled to the node of the reference voltage signal.

8. The apparatus of claim 6, wherein:
a drain terminal of the NMOS transistor is coupled to the low voltage rail via the first resistor; and
a bulk terminal of NMOS transistor is coupled to the low voltage rail.

9. The apparatus of claim 5, wherein the tracking circuitry further comprises:
at least a third resistor coupled in series between the node of the reference voltage signal and the low voltage rail.

10. The apparatus of claim 4, wherein the NMOS transistor is diode connected, with its gate terminal coupled to its source terminal and the node of the reference voltage signal.

11. The apparatus of claim 1, wherein the tracking circuitry is configured to generate the reference voltage signal as a fraction of the voltage supply signal, and wherein:
the voltage regulator circuitry is configured to operate with a closed loop gain of 2;
the voltage supply signal is 1.1 volts (V); and
the reference voltage signal is 550 millivolts (mV).

12. The apparatus of claim 1, wherein the amplifier circuitry comprises a plurality of transistors configured as a biased, degenerated inverter.

13. The apparatus of claim 1, wherein the amplifier circuitry comprises a biasing circuit including at least a first field effect transistor and a second field effect transistor, and wherein a gate of the first field effect transistor is coupled to a drain of the first field effect transistor, a gate of the second field effect transistor and a drain of the second field effect transistor.

14. A wireless communication device, comprising:
an antenna array configured to receive a plurality of radio frequency (RF) signals;
RF circuitry configured to amplify the plurality of RF signals received via the antenna array to generate one or more amplified RF signal;
digital baseband circuitry coupled to the RF circuitry and configured to generate a digital output signal for processing by a wireless modem, the digital output signal based on the one or more amplified RF signals; and
power supply circuitry coupled to the RF circuitry and the digital baseband circuitry, the power supply circuitry configured to generate a voltage supply signal for the RF circuitry and the digital baseband circuitry based on a reference voltage signal, wherein the reference voltage signal tracks process and temperature variations within the wireless communication device.

15. The wireless communication device of claim 14, wherein:
the digital baseband circuitry is further configured to receive the voltage supply signal from the power supply circuitry, receive a digital signal from the wireless modem, and generate an RF signal based on the digital signal and the voltage supply signal;
the RF circuitry is configured to amplify the RF signal using amplification circuitry, to generate an amplified RF signal for transmission via the antenna array; and
the power supply circuitry is configured to generate the reference voltage signal tracking the process and temperature variations as a fraction of the voltage supply signal.

16. The wireless communication device of claim 14, wherein the power supply, circuitry comprises:
a current source configured to generate a reference current signal;
process and temperature tracking circuitry configured to generate the reference voltage signal based on the reference current signal; and
voltage regulator circuitry configured to generate the voltage supply signal based on the reference voltage signal.

17. The wireless communication device of claim 16, wherein the voltage regulator circuitry is configured to modulate the voltage supply signal on the reference voltage signal.

18. The wireless communication device of claim 16, wherein the process and temperature tracking circuitry comprises:
a first metal-oxide-semiconductor field-effect transistor (MOSFET) electrically coupled in series with a second MOSFET,
wherein a drain terminal the first MOSFET is coupled to a drain terminal of the second MOSFET, and
wherein the first MOSFET is diode-connected, with its gate terminal being coupled to its drain terminal.

19. The wireless communication device of claim 18, wherein the second MOSFET is diode-connected, with its gate terminal being coupled to its drain terminal.

20. The wireless communication device of claim 18, wherein the first MOSFET and the second MOSFET are coupled in a complementary metal-oxide-semiconductor (CMOS) inverter configuration, wherein:
a source terminal of the first MOSFET is coupled to the current source;
a bulk terminal and a source terminal of the second MOSFET coupled to ground; and
the source terminal of the first MOSFET is further configured to supply at least a portion of the reference voltage signal to the voltage regulator circuitry.

21. A voltage supply apparatus, comprising:
a current source coupled to a rail voltage source and configured to generate a reference current signal;
tracking circuitry coupled to the current source and configured to generate a reference voltage signal based on the reference current signal, wherein the tracking circuitry comprises a plurality of field effect transistors coupled in series to form a self-biased inverter, and wherein the reference voltage signal is generated at a node between a source terminal of at least one of the plurality of field effect transistors and the current source, to tracks process and temperature variations associated with one or more of the plurality of field effect transistors; and
voltage regulator circuitry coupled to the tracking circuitry and configured to generate a voltage supply signal based on the reference voltage signal.

22. The voltage supply apparatus of claim 21, wherein the plurality of field effect transistors comprises:
a first field effect transistor having its source terminal coupled to the current source and its bulk terminal coupled to the rail voltage source; and a second field effect transistor having its source and bulk terminals coupled to ground, and having its drain terminal coupled to a drain terminal of the first field effect transistor.

23. The voltage supply apparatus of claim 22, wherein a gate terminal of the first field effect transistor is coupled to a gate terminal of the second field effect transistor.

24. The voltage supply apparatus of claim 22, wherein the first field effect transistor is a p-type metal-oxide-semiconductor (PMOS) transistor, the second field effect transistor is an n-type metal-oxide-semiconductor (NMOS) transistor, and wherein:
- the PMOS transistor is diode-connected, with its gate terminal being coupled to its drain terminal; and
- the NMOS transistor is diode-connected, with its gate terminal being coupled to its drain terminal.

\* \* \* \* \*

UNITED STATES PATENT AND TRADEMARK OFFICE
CERTIFICATE OF CORRECTION

PATENT NO. : 11,329,650 B2
APPLICATION NO. : 16/957615
DATED : May 10, 2022
INVENTOR(S) : Parkes, Jr. et al.

It is certified that error appears in the above-identified patent and that said Letters Patent is hereby corrected as shown below:

In the Claims

In Column 28, Line 9, in Claim 16, delete "supply," and insert --supply-- therefor Signed and Sealed this
Twentieth Day of December, 2022

Katherine Kelly Vidal
*Director of the United States Patent and Trademark Office*